(12) United States Patent
Thubert et al.

(10) Patent No.: US 11,564,327 B2
(45) Date of Patent: *Jan. 24, 2023

(54) CONNECTORS FOR A NETWORKING DEVICE WITH ORTHOGONAL SWITCH BARS

(71) Applicant: Cisco Technology, Inc., San Jose, CA (US)

(72) Inventors: Pascal Thubert, Loup (FR); Charles Calvin Byers, Wheaton, IL (US)

(73) Assignee: Cisco Technology, Inc., San Jose, CA (US)

(*) Notice: Subject to any disclaimer, the term of this patent is extended or adjusted under 35 U.S.C. 154(b) by 700 days.

This patent is subject to a terminal disclaimer.

(21) Appl. No.: 16/514,623

(22) Filed: Jul. 17, 2019

(65) Prior Publication Data

US 2020/0146170 A1  May 7, 2020

Related U.S. Application Data

(60) Provisional application No. 62/755,586, filed on Nov. 5, 2018.

(51) Int. Cl.
*H05K 7/14* (2006.01)
*H01R 13/193* (2006.01)
(Continued)

(52) U.S. Cl.
CPC .............. *H05K 7/1492* (2013.01); *G01J 1/44* (2013.01); *G02B 6/4246* (2013.01); *G06F 1/263* (2013.01);
(Continued)

(58) Field of Classification Search
CPC .... H05K 7/1492; H05K 7/16; H05K 7/20263; H05K 7/1444; H05K 7/1485; H05K 7/20736; H05K 7/20781; G01J 1/44; G02B 6/4246; G06F 1/263; G06F 1/3209; G06F 2200/201; G06F 1/20; G06F 1/28; G06F 1/30; G06F 15/161; H01R 13/193;
(Continued)

(56) References Cited

U.S. PATENT DOCUMENTS 5,339,396 A     8/1994  Muramatsu et al.
2001/0021187 A1 9/2001  Saeki et al.
(Continued)

OTHER PUBLICATIONS

International Search Report and Written Opinion, issued in International Application No. PCT/US2019/058818 dated Feb. 26, 2020, 18 pgs.

*Primary Examiner* — Jung Kim
(74) *Attorney, Agent, or Firm* — Merchant & Gould P.C.

(57) ABSTRACT

Connectors for a networking device may be provided. A networking device may comprise a first plurality of switch bars each comprising a first switch type arranged parallel to one another, a second plurality of switch bars each comprising a second switch type arranged parallel to one another, and a third plurality of switch bars each comprising a third switch type arranged parallel to one another. The first plurality of switch bars, the second plurality of switch bars, and the third plurality of switch bars may be arranged orthogonally. A first one of the first plurality of switch bars may be connected to a first one of the second plurality of switch bars via a retractable mechanical connector mechanism.

20 Claims, 20 Drawing Sheets

(51) Int. Cl.
| | |
|---|---|
| *H05K 7/20* | (2006.01) |
| *H05K 7/16* | (2006.01) |
| *G02B 6/42* | (2006.01) |
| *H01R 43/26* | (2006.01) |
| *G01J 1/44* | (2006.01) |
| *H04Q 11/00* | (2006.01) |
| *H04L 49/15* | (2022.01) |
| *G06F 1/26* | (2006.01) |
| *G06F 1/3209* | (2019.01) |
| *H04L 49/101* | (2022.01) |
| *H04B 10/60* | (2013.01) |
| *H04B 10/50* | (2013.01) |

(52) U.S. Cl.
CPC ......... *G06F 1/3209* (2013.01); *H01R 13/193* (2013.01); *H01R 43/26* (2013.01); *H04L 49/101* (2013.01); *H04L 49/15* (2013.01); *H04Q 11/0005* (2013.01); *H04Q 11/0062* (2013.01); *H05K 7/16* (2013.01); *H05K 7/20263* (2013.01); *H04B 10/50* (2013.01); *H04B 10/60* (2013.01); *H04Q 2011/0041* (2013.01); *H04Q 2011/0058* (2013.01); *H04Q 2011/0096* (2013.01)

(58) Field of Classification Search
CPC ....... H01R 43/26; H04L 49/101; H04L 49/15; H04L 49/405; H04Q 11/0005; H04Q 11/0062; H04Q 2011/0041; H04Q 2011/0058; H04Q 2011/0096; H04B 10/50; H04B 10/60
See application file for complete search history.

(56) References Cited

U.S. PATENT DOCUMENTS

| | | |
|---|---|---|
| 2011/0302346 A1 | 12/2011 | Vahdat et al. |
| 2019/0246187 A1* | 8/2019 | Wong .................... H04B 10/40 |

* cited by examiner

US 11,564,327 B2

CONNECTORS FOR A NETWORKING DEVICE WITH ORTHOGONAL SWITCH BARS

RELATED APPLICATION TECHNICAL FIELD

Under provisions of 35 U.S.C. § 119(e), Applicant claims the benefit of U.S. Provisional Application No. 62/755,586 filed Nov. 5, 2018, which is incorporated herein by reference.

TECHNICAL FIELD

The present disclosure relates generally to network data centers such as high-density enterprise data centers.

BACKGROUND

Cloud computing is a model that allows access to a shared pool of configurable computing resources. Cloud computing and storage solutions provide users and enterprises with various capabilities to store and process their data in third-party data centers. It shares resources to achieve coherence and economies of scale.

Cloud computing also focuses on maximizing the effectiveness of the shared resources. Cloud resources are usually not only shared by multiple users, but are also dynamically reallocated per demand. This can work for allocating resources to users. For example, a cloud computer facility that serves European users during European business hours with a specific application (e.g., e-mail) may reallocate the same resources to serve North American users during North American business hours with a different application (e.g., a web server). This approach helps maximize computing power use while reducing the overall resources cost by using, for example, less power, less air conditioning, and less rack space, to provide the required functions. With cloud computing, like other client-server architectures, multiple users can access a single server to retrieve and update their data without purchasing licenses for different applications.

Interconnecting these shared resources is an important challenge. In conventional data centers, several layers of IP switches, and large numbers of cabled Ethernet connections complete the interconnect between servers, storage engines, networking devices, appliances, and other endpoints to enable the cloud to perform its required application services. In large data centers, these switches and interconnects can be difficult to install and configure, consume large physical volumes, energy and cooling resources, and are expensive. Multiple layers of switches including spine, leaf and top of rack, and techniques such as fat trees, which may consist of layers of richly interconnected switches, are often employed to address these challenges.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
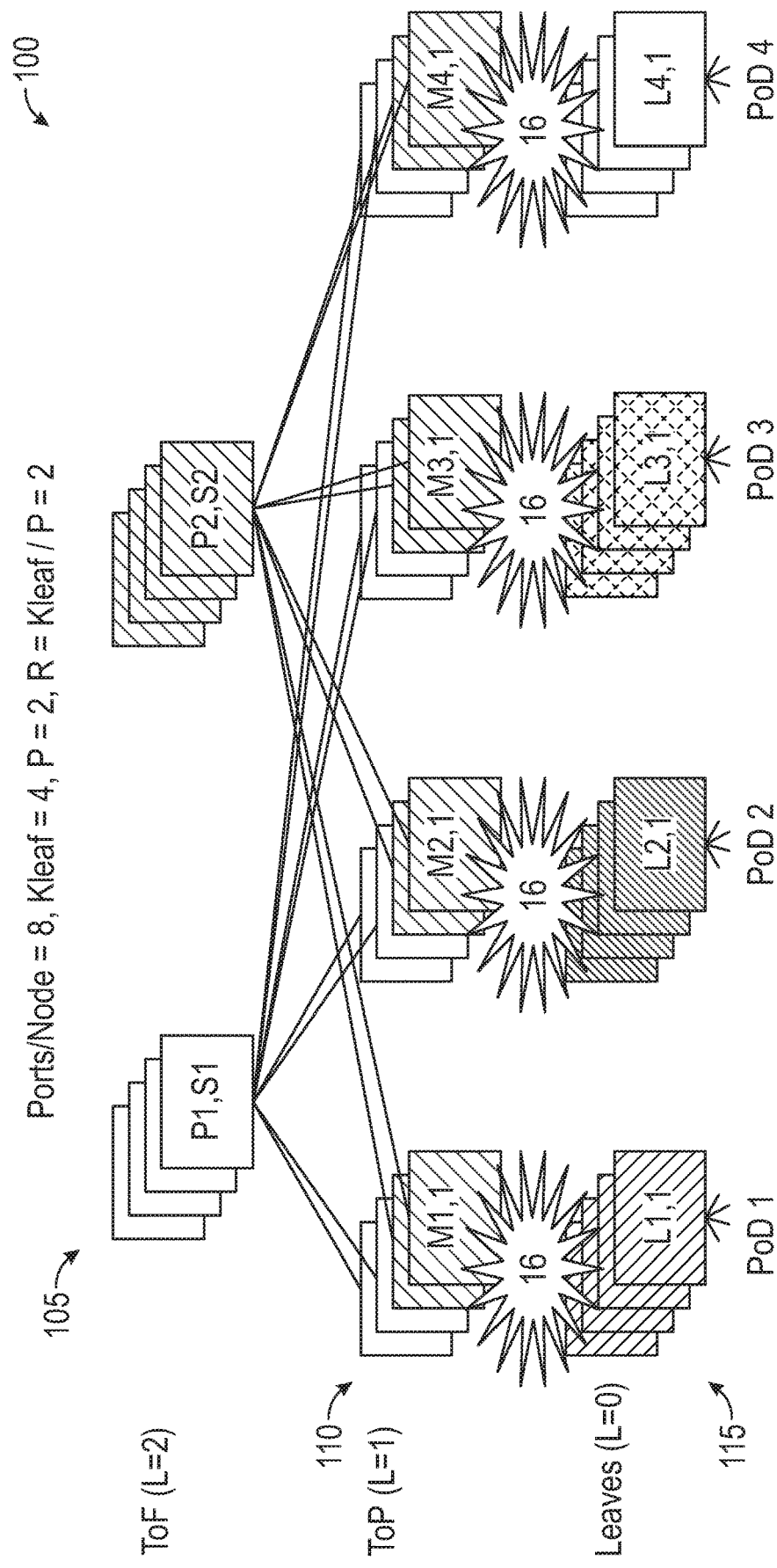
FIG. 1 is a block diagram of a logical conception of a network.

Connectors for a networking device may be provided. A networking device may comprise a first plurality of switch bars each comprising a first switch type arranged parallel to one another, a second plurality of switch bars each comprising a second switch type arranged parallel to one another, and a third plurality of switch bars each comprising a third switch type arranged parallel to one another. The first plurality of switch bars, the second plurality of switch bars, and the third plurality of switch bars may be arranged orthogonally. A first one of the first plurality of switch bars may be connected to a first one of the second plurality of switch bars via a retractable mechanical connector mechanism.

Both the foregoing overview and the following example embodiments are examples and explanatory only, and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

A logical conception of a network may be illustrated in FIG. 1. Embodiments of the disclosure may comprise turning the logical conception shown in FIG. 1 into a physical apparatus. FIG. 1 shows a three-level hierarchy of switching resources 100, as commonly implemented in fat pipe architectures in high capacity data centers. These levels may include a Top-of-Fabric (ToF) level 105, a Top-of-Pod (ToP) level 110, and a leaf level 115, each implemented by a unique type of switch or router chassis. The ToP and leaf levels may be grouped into pods. Connections shown on the bottom of the pods may go to individual elements in the data center, such as servers, storage engines, or network devices. Interconnects, comprising Ethernet cables, may connect the various levels. There may be inefficiencies in conventional implementations, including a large number of cables, significant power to drive, physical space to terminate them, scaling concerns, and serviceability challenges.

By building switches in the form of elongated rectangular prism shaped bars with ports (e.g., connectors) on two or more sides of a bar, a three-dimensional apparatus may be built that may implement a fat tree without wires connecting the switches. Each of these bars may take the place of an entire chassis-level switch described in FIG. 1. This apparatus may be efficient in terms of space, power, and cost. For example, with respect to FIG. 1, for switches with 8 ports, KLeaf=4, an apparatus with KLeaf=KTop=Nb of Pods may be provided, though KLeaf=8, 12, 16, or 24 may also be used. In the FIG. 1 example, a cube of four pods (e.g., PoD 1, PoD 2, PoD 3, and PoD 4) may be provided.

Embodiments of the disclosure may have N the same for all three dimensions resulting in a cube, but there may be a different value, for example, M, L, and N in all three dimensions. Accordingly, there may be in each PoD K bars of 2*N ports as leaves and N bars of 2*K ports as ToP. There may be 2*M ports on a ToF bar, M being the maximum number of ToP that the bar can connect.

Consistent with embodiments of the disclosure, a bar (e.g., an elongated rectangular prism shaped bar) as a highly integrated switch may interconnect with other similar bar shaped switches in orthogonal planes via connection ports on its sides. A bar may be a rectangular prism on the order of 20-40 mm wide, 20-40 mm tall, and up to 800 mm long for example. These bars may be stacked in a three-dimensional array, with numerous contact points where orthogonal bars touch, and various channels and apertures between them. As will be described in greater detail below, vertical bars in every other vertical hole may provide a spine (i.e., Top-of-Fabric (ToF) in Routing in Fat Trees (RIFT)). This may create cable-free interconnect paths between leaf switches and Top-of-Pod (ToP) switches (described in greater detail below) in the contact points between two of the dimensions, and the paths between ToP and ToF switches in the contact points between a different two dimensions. In addition to the connection ports (e.g., connectors) on various long sides of the bars, there may also be inlet and exhaust apertures for coolant. Power and management links may be on one of the small surfaces of the bars. Together, this array of three dimensions of switch bars may implement a fat tree without the equipment and cabling complexities found in conventional data center networking implementations.

The links between switches (or routers) do not usually connect other devices. Thus, they may not have to be implemented as expensive, power hungry, and space inefficient Cat6 RJ45 connectors and they may not have to be implemented on the face of the switch. Embodiments of the disclosure may include smaller ports (i.e., connectors), and may place them on the top and the bottom of the bottom switch bars (e.g., the leaf switches) and on the bottom and the sides of the top switch bars (e.g., the ToP switches). The vertical bars may comprise spine switches (i.e., ToF switches), with connectors on their fronts and backs.

With embodiments of the disclosure, the vertical spine switches (i.e., ToF switches) may have ports (i.e., connectors) on both sides, then the number of planes may be divided by two and provide 2× redundancy in the fabric in each plane. Accordingly, consistent with embodiments of the disclosure:

a) connections may be established by stacking switch bars in three different orientations;
b) inter-switch cables may be replaced with simpler bar contact point connections; and
c) connections may be smaller, thus equipment density may be higher, and overall power dissipation reduced.

Consistent with embodiments of the disclosure, pods may include a first plurality of switch bars (e.g., leaf switch bars) oriented, for example, parallel to the X axis, and a second plurality of switch bars (e.g., ToP switch bars) directly above them parallel to the Y axis, creating a pod. A plurality of these two layered pods may be stacked in a rack, and a third plurality of switch bars (e.g., spine switch bars or ToF switch bars) may be threaded through a subset of gaps left between the first plurality of switch bars and the second plurality of switch bars, parallel to the Z axis, thus completing three mutually orthogonal planes of switching for a fat tree architecture.

Building a Pod

Figure 2:
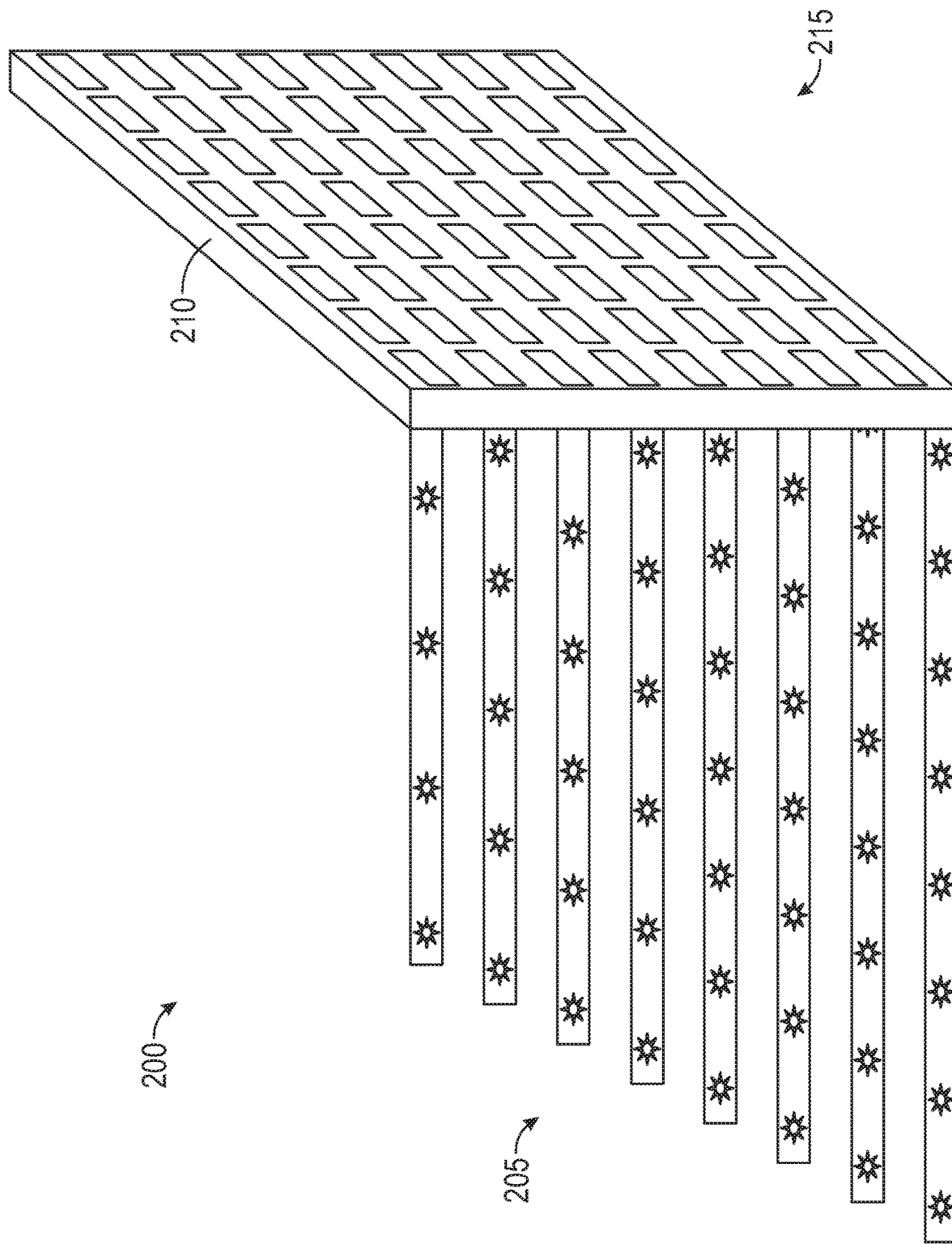
FIG. 2 illustrates an L-shaped backplane.

The leaf switches (e.g., first plurality of switch bars) may comprise bars, with 2×N ports, half of the ports on the top of the bar and half on the bottom of the bars. The bottom may connect to host servers. In order to bring the connectivity from the bottoms of the leaf switch bars to external cables to the host servers, an "L-shaped" backplane 200 may be used. As shown in FIG. 2, L-shaped backplane 200 may comprise a plurality of connectivity bars 205 and a front plate 210 having a plurality of front plate connectors 215. L-shaped backplane 200 may connect the ports coming out of the array of leaf switches (e.g., first plurality of switch bars) to a connector panel (i.e., front plate 210) where, for example, RJ-45 metallic connectors or fiber interface modules (i.e., front plate connectors 215) may be located to connect to host servers. Although one front plate 210 serving an entire pod is shown in FIG. 2, embodiments of the disclosure may have one smaller panel for each leaf switch bar, individually removable and replaceable for example.

Figure 3:
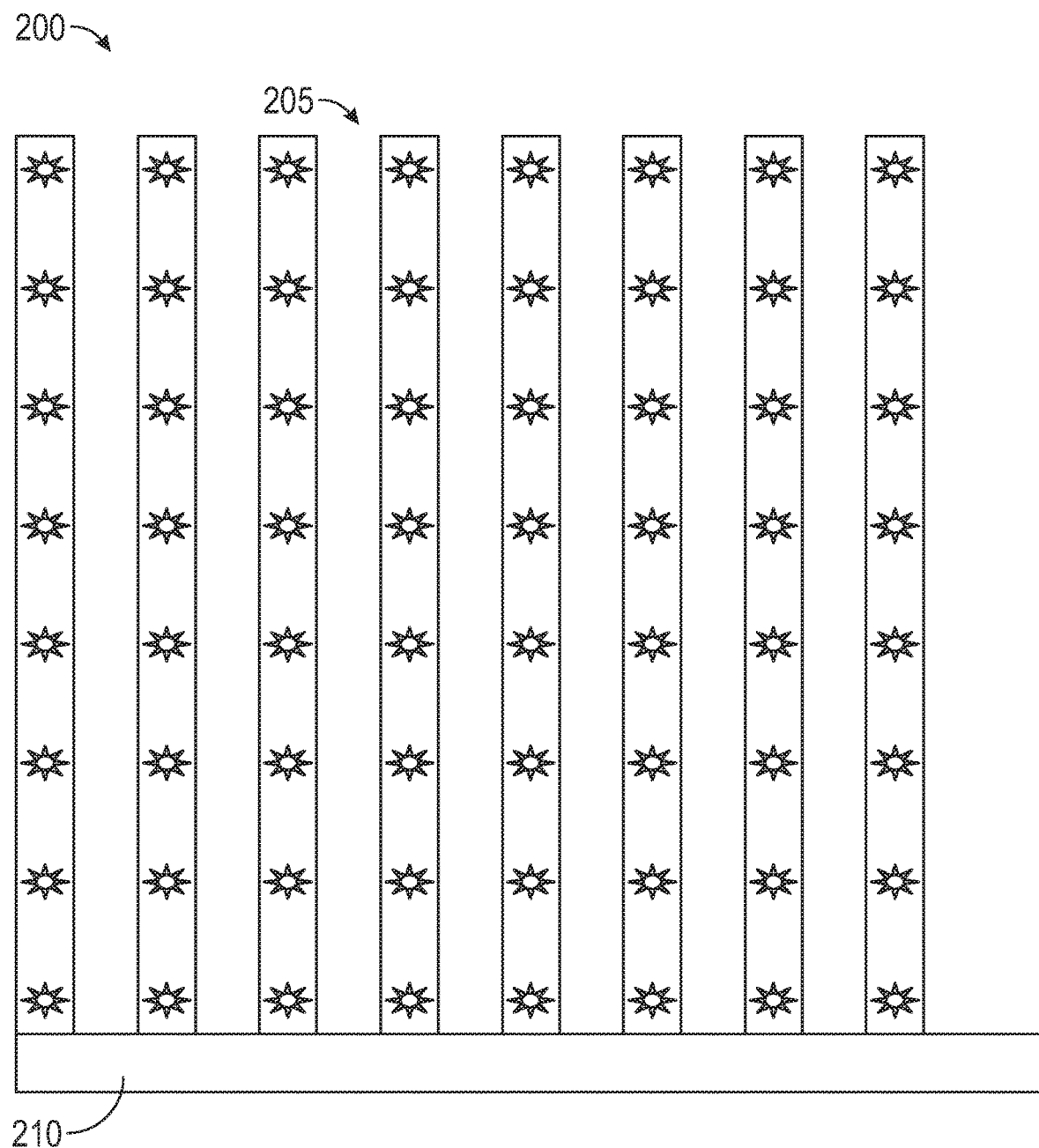
FIG. 3 illustrates an L-shaped backplane from a top of a rack.

The connectors on front plate 210 (i.e., front plate connectors 215) may comprise, but are not limited to, RJ-45 connectors or pluggable modules such as Small Form-factor Pluggable (SFP), Quad Small Form-factor Huggable (QSFP), 10 gigabit Small Form-factor Pluggable (XFP), or other types. FIG. 3 shows L-shaped backplane 200 from a top of a rack. Connectors between L-shaped backplane 200 and the first layer of switch bars may not necessarily be RJ-45 and may be designed so that the female on the top side may connect to a male on the bottom side while the pod switch above is oriented at 90 degrees. To enable an easy insertion, the connectors may be point shaped or optical. As described herein, the connectors may be illustrated in the shape of an eight-pointed star for example.

Figure 4:
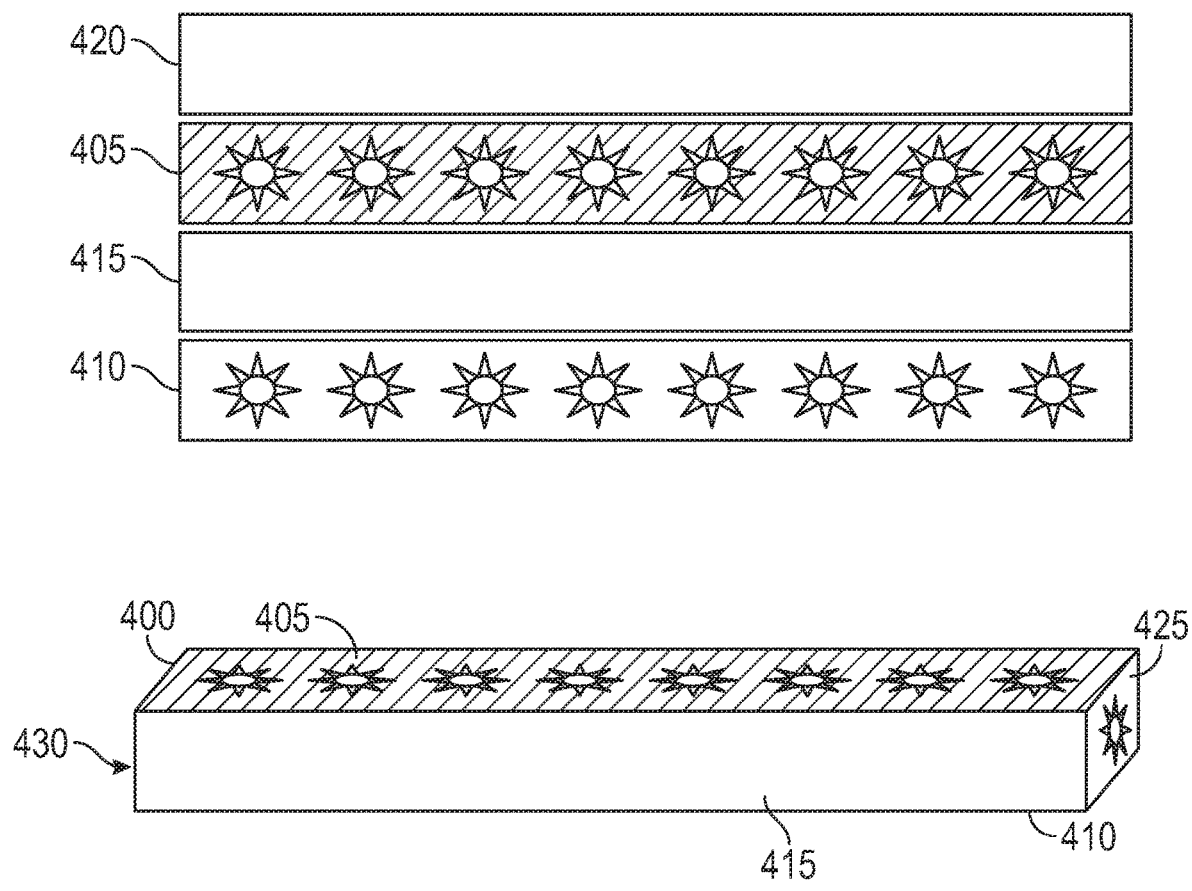
FIG. 4 illustrates an example leaf switch bar.
Figure 5:
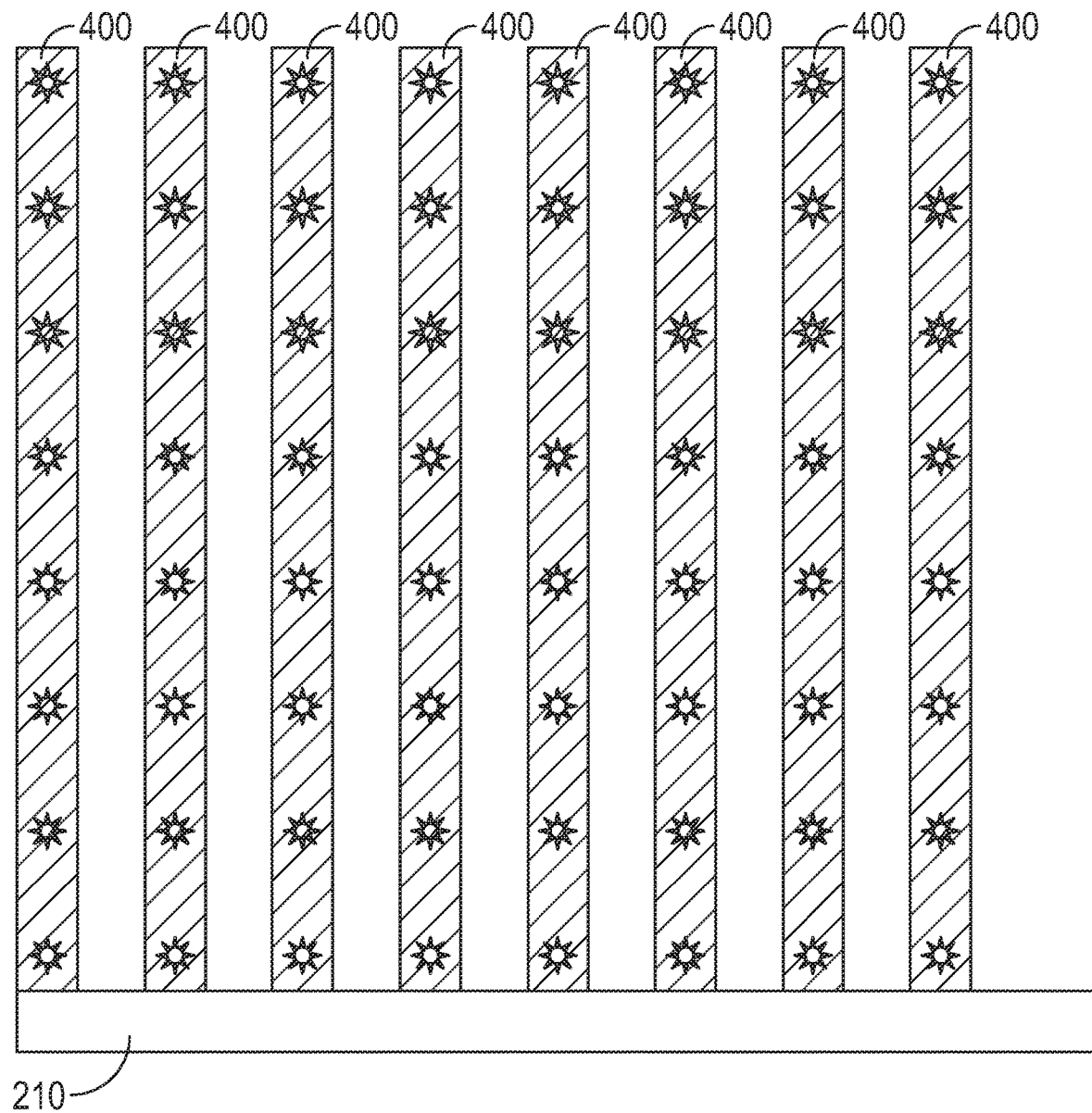
FIG. 5 illustrates leaf switch bars connected along corresponding connectivity bars of an L-shaped backplane from a top of a rack.
Figure 6:
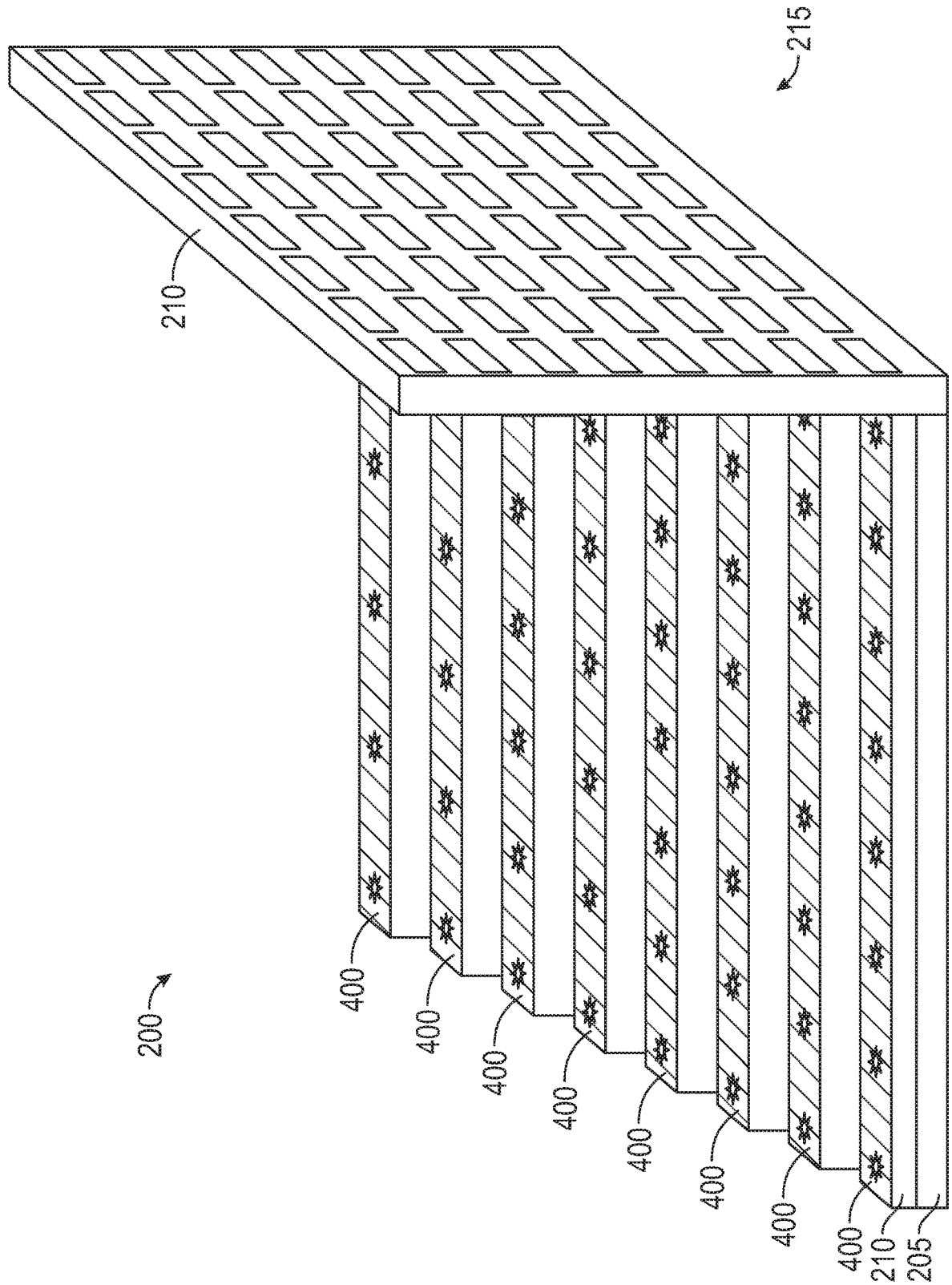
FIG. 6 illustrates leaf switch bars plug along corresponding connectivity bars of an L-shaped backplane.

FIG. 4 illustrates an example leaf switch bar 400. As shown in FIG. 4, leaf switch bar 400 may comprise a top 405 comprising a plurality of connectors, a bottom 410 comprising a plurality of connectors, a first side 415, and a second side 420. The cross-sectional size of leaf switch bars 400 may be based on the number of bars placed across the intended mounting rack. One connector per leaf switch bar 400 output port (e.g., serving cables connecting to servers, storage devices, networking devices, or other equipment in a wire center) may appear on bottom 410, and one connector per ToP switch may appear on top 405. A first end 425 of leaf switch bar 400 may include a set of power and management port connectors. A second end 430 of leaf switch bar 400 may include status indicator LEDs, and retention latches. Also, first side 415 and second side 420 of leaf switch bar 400 may include some apertures for coolant to pass through leaf switch bar 400 and across internal heat sinks as described in greater detail below. As shown in FIG. 5 and FIG. 6, leaf switch bars 400 may plug along corresponding connectivity bars 205 of L-shaped backplane 200.

Top of Pod (ToP) Switch Level

The switch level above in the leaf switches (i.e., the first plurality of switch bars) may comprise the ToP switches (i.e., the second plurality of switch bars), which may be formed from similar bars at the leaf switches, but rotated 90 degrees. A cross layer of bars may be applied by plugging bars on bars so that every bar at the lower layer (i.e., leaf switches) may be connected to every bar at the above layer (i.e., ToP switches). This may provide N^2 contact points, which implement the leaf to ToP switch cables shown in FIG. 1. The ToP switch bars may be similar to the leaf switch bars, but the connectors may be arranged differently.

Figure 7:
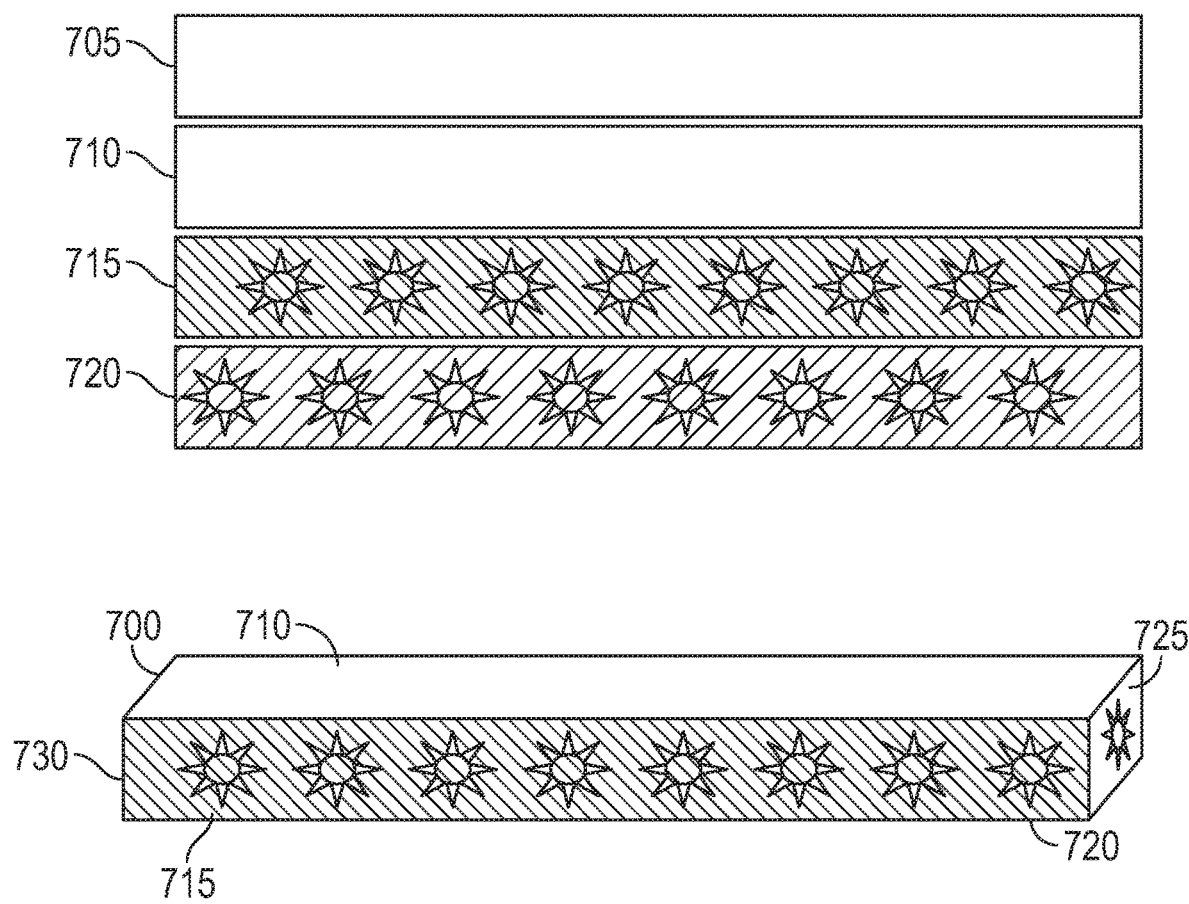
FIG. 7 illustrates an example even Top-of-Pod (ToP) switch bar.

FIG. 7 illustrates an example ToP switch bar 700. As shown in FIG. 7, ToP switch bar 700 may have a first side 705, a top 710, a second side 715, and a bottom 720. Bottom 720 of ToP switch bar 700 may have a plurality of connectors to interconnect with leaf switch bars 400 arranged in an orthogonal direction directly below. Second side 715 of each ToP switch bar 700 may have a plurality of connectors that connect to the ToF switch bars (i.e., spine switch bars or the third plurality of switch bars) that may be immediately adjacent, but arranged vertically. As before, one end 725 of the ToP switch bar 700 may have connectors to provide power and management, and another end 730 may include status indicators and retention latches. In some embodiments, cooling passages may exist on first side 705 and second side 715 to allow passage of coolant between cooling channels through heat-producing elements inside ToP switch bar 700.

Consistent with embodiments of the disclosure, the number of planes may be divided where even and odd type ToP switch bars 700 may be used. This may allow ToF switch bars (i.e., spine switch bars or the third plurality of switch bars) in the middle to connect to ToP switch bars 700 both towards the back and the front of the rack. FIG. 7 illustrate an even type ToP switch bar 700. With an odd type ToP switch bar 700, first side 705 may have the plurality connectors that connect to the ToF switch bars (i.e., spine switch bars or the third plurality of switch bars) rather than second side 715.

Figure 8:
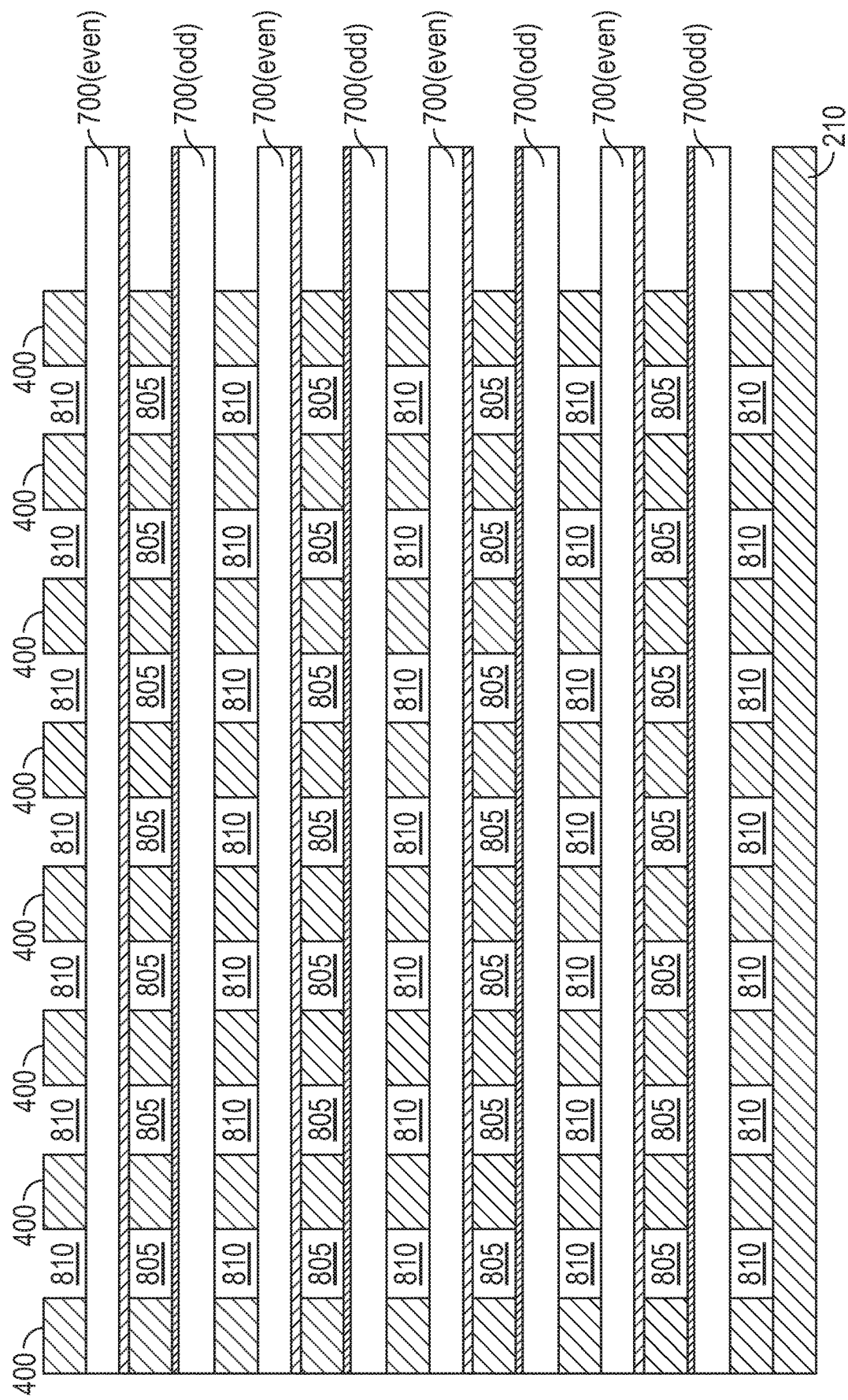
FIG. 8 illustrates a top view of a placement and connection of ToP switch bars to leaf switch bars.
Figure 9:
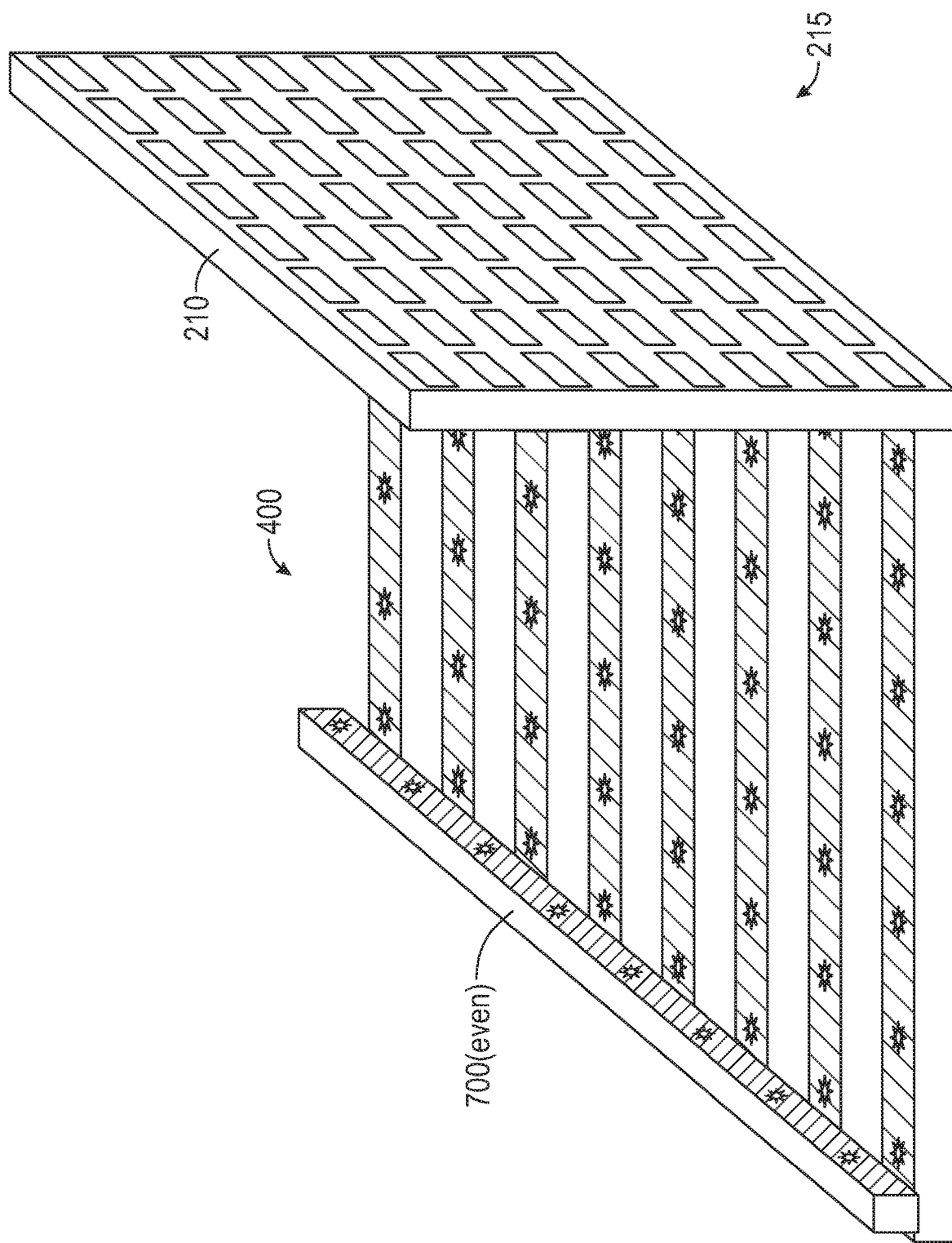
FIG. 9 illustrates a placement and connection of a ToP switch bar (e.g., even type) to a plurality of leaf switch bars.

FIG. 8 illustrates a top view of the placement and connection of ToP switch bars 700 to leaf switch bars 400 to form a pod. As shown in FIG. 8, the ToF switch bars may be placed in first interstice gaps 805 and second interstice gaps 810 may be used for cooling passages as described in greater detail below. The contact surfaces of even and odd ToP switch bars 700 face each other across first interstice gaps 805. FIG. 9 illustrates the placement and connection of ToP switch bar 700 (e.g., even type) to a plurality of leaf switch bars 400.

Multiple Pods

Figure 10:
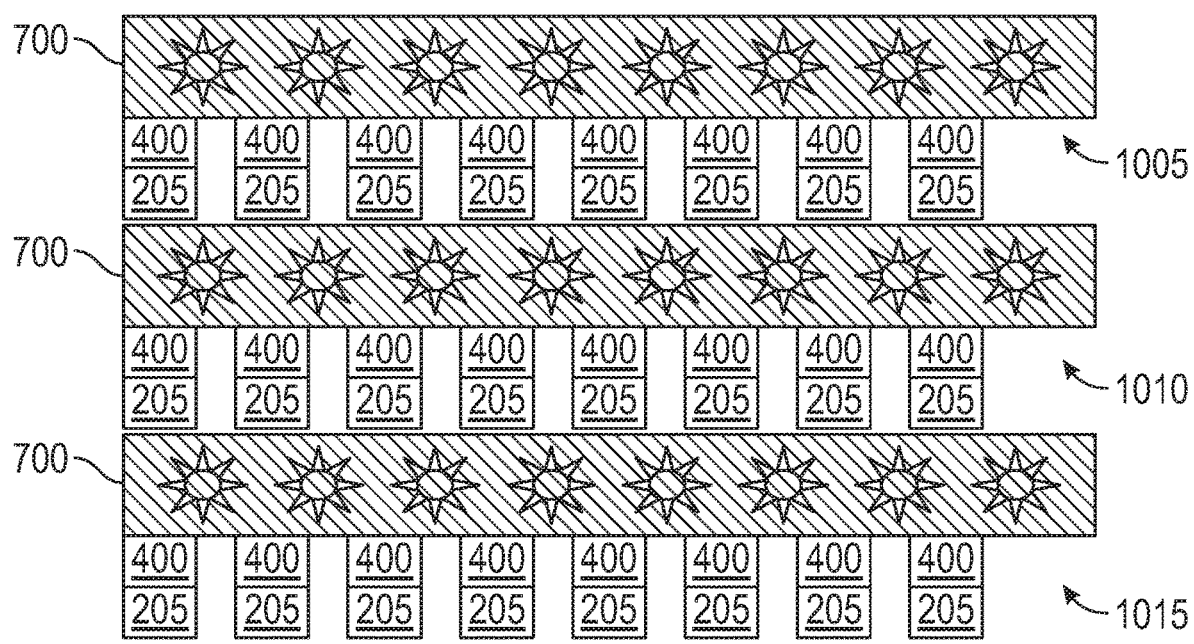
FIG. 10 illustrates a first pod, a second pod, and a third pod stacked upon one another.

One objective of a Cos or a fat tree may be to have many pods interconnected by a spine switch (i.e., ToF switch). Each Pod may comprise one or more Rack Units (RUs) high. Multiple pods may be placed in a rack, one above the other all the way up the rack. FIG. 10 illustrates a first pod 1005, a second pod 1010, and a third pod 1015 stacked upon one another. In the cross-section shown in FIG. 10, connectors (e.g., the eight-pointed stars) on the sides of odd ToP switches 700 may be connected to the vertical ToF switch bars that interlink pods as described in greater detail below.

The Spine

Figure 11:
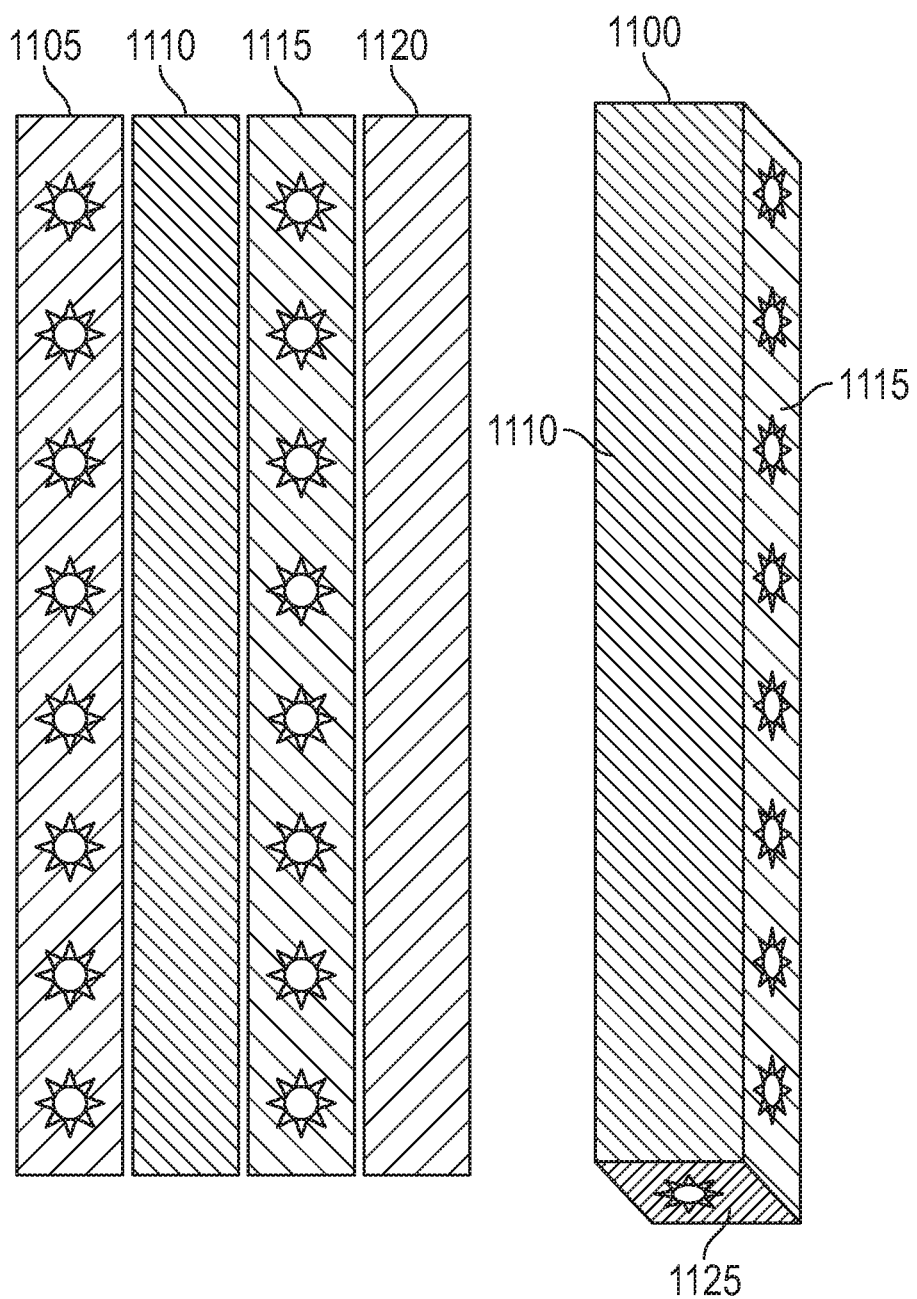
FIG. 11 illustrates an example Top-of-Fabric (ToF) switch bar.

FIG. 11 illustrates an example ToF switch bar 1100. ToF switch bar 1100 may be used for spine switch bars (i.e., the third plurality of switch bars). As shown in FIG. 11, ToF switch bar 1100 may have a first side 1105, a top 1110, a second side 1115, and a bottom 1120. First side 1105 of ToF switch bar 1100 may have a plurality of connectors to interconnect with ToP switch bars 700 (e.g., even type) arranged in an orthogonal direction. Second side 1115 of each ToF switch bar 1100 may have a plurality connectors that connect to ToP switch bars 700 (e.g., odd type) arranged in an orthogonal direction.

ToF switch bars 1100 may be organized vertically. Because they have ports on both sides, the number of planes may be divided by 2, meaning K/2 planes total (because each ToF switch bar 1100 may be able to service two rows of ToP switch bars 700 in each pod). There may be connectors on ends 1125 of ToF switch bars 1100 that may connect power and management to ToF switch bars 1100, and also for expansion connections (i.e., communications connector) to a plurality of ringing bars to provide a ringing layer as described in greater detail below.

Connectors on ends 1125 of ToF switch bars 1100 may also be used to connect ToF switch bars 1100 together end-to-end to lengthen ToF switch bars 1100 if the original is, for example, half the full size. This may allow the ToF level to be expanded as needed, for example, starting with a quarter or one-half of the maximum number of pods and then adding more. Initially, it may be enough that ToF switch bars 1100 are a quarter or one-half the number of ports, as long as they can be expanded by plugging in additional ToF switch bars 1100 end-to-end.

Figure 12:
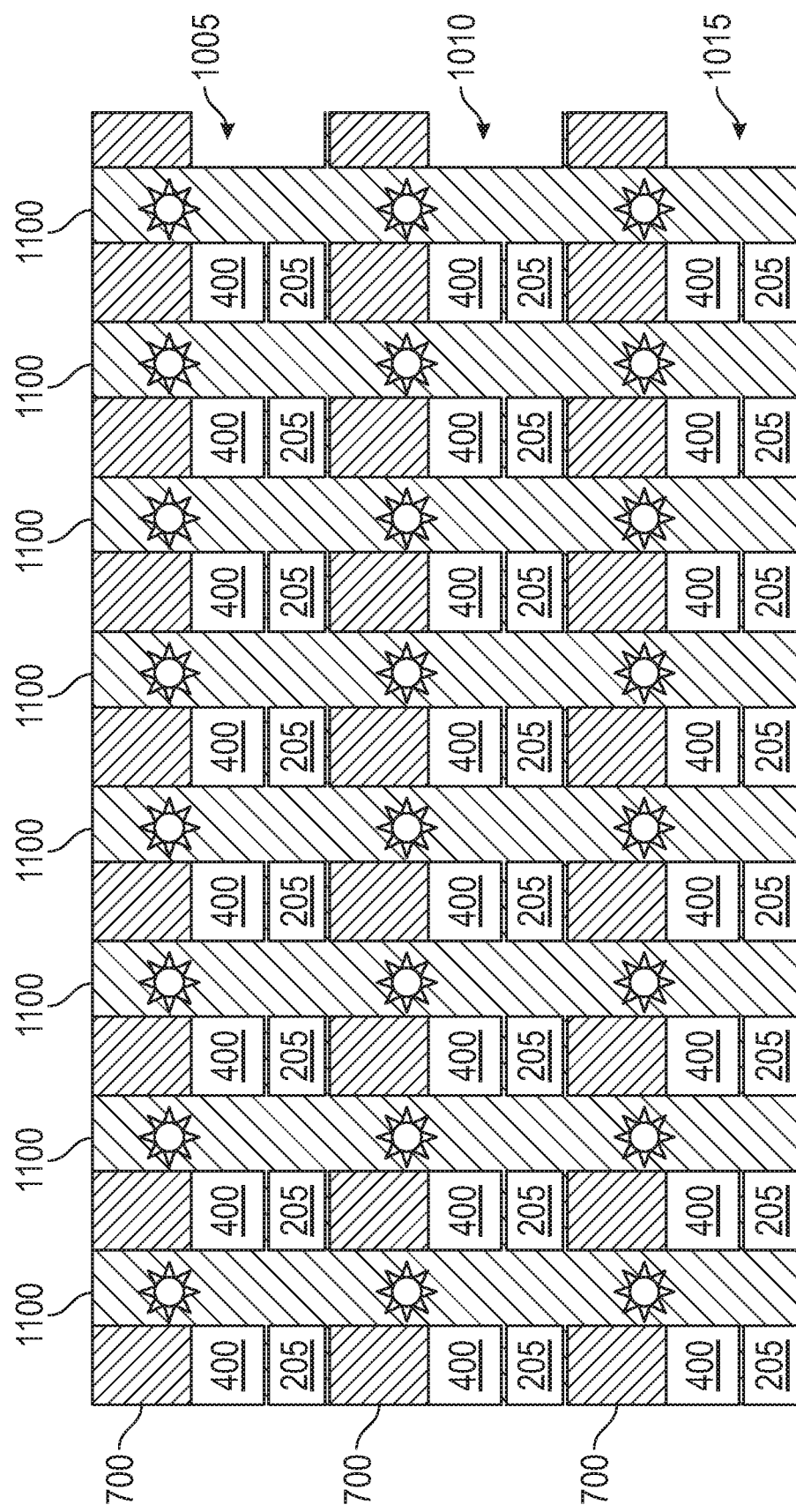
FIG. 12 illustrates ToF switch bars inserted into and connected with the stacked pods shown in FIG. 10.
Figure 13:
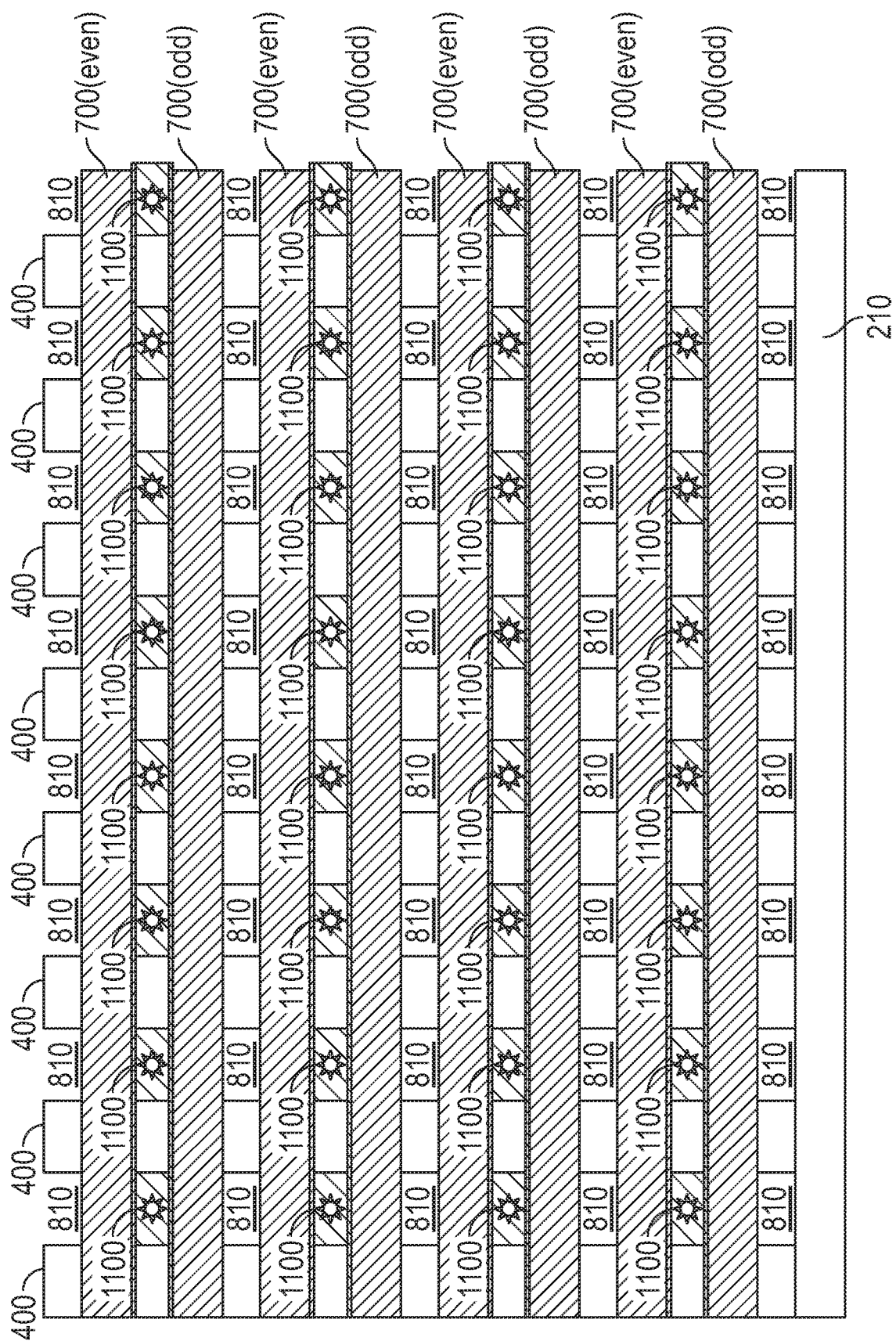
FIG. 13 illustrates a top view of FIG. 8 of a placement and connection of ToP switch bars to leaf switch bars with ToF switch bars placed in first interstice gaps.

FIG. 12 illustrates ToF switch bars 1100 inserted into and connected with the stacked pods shown in FIG. 10. The size of the structure shown in FIG. 12 may be increased by expanding ToF switch bars 1100 as described above and adding more pods. FIG. 13 illustrates the top view of FIG. 8 of the placement and connection of ToP switch bars 700 to leaf switch bars 400. In contrast with FIG. 8, FIG. 13 shows ToF switch bars 1100 placed in first interstice gaps 805, making connections between their side 1105 connectors and odd ToP switch bar side 715 connectors. Second interstice gaps 810 may be empty in FIG. 13, but may be used for coolant as described in greater detail below.

Figure 14:
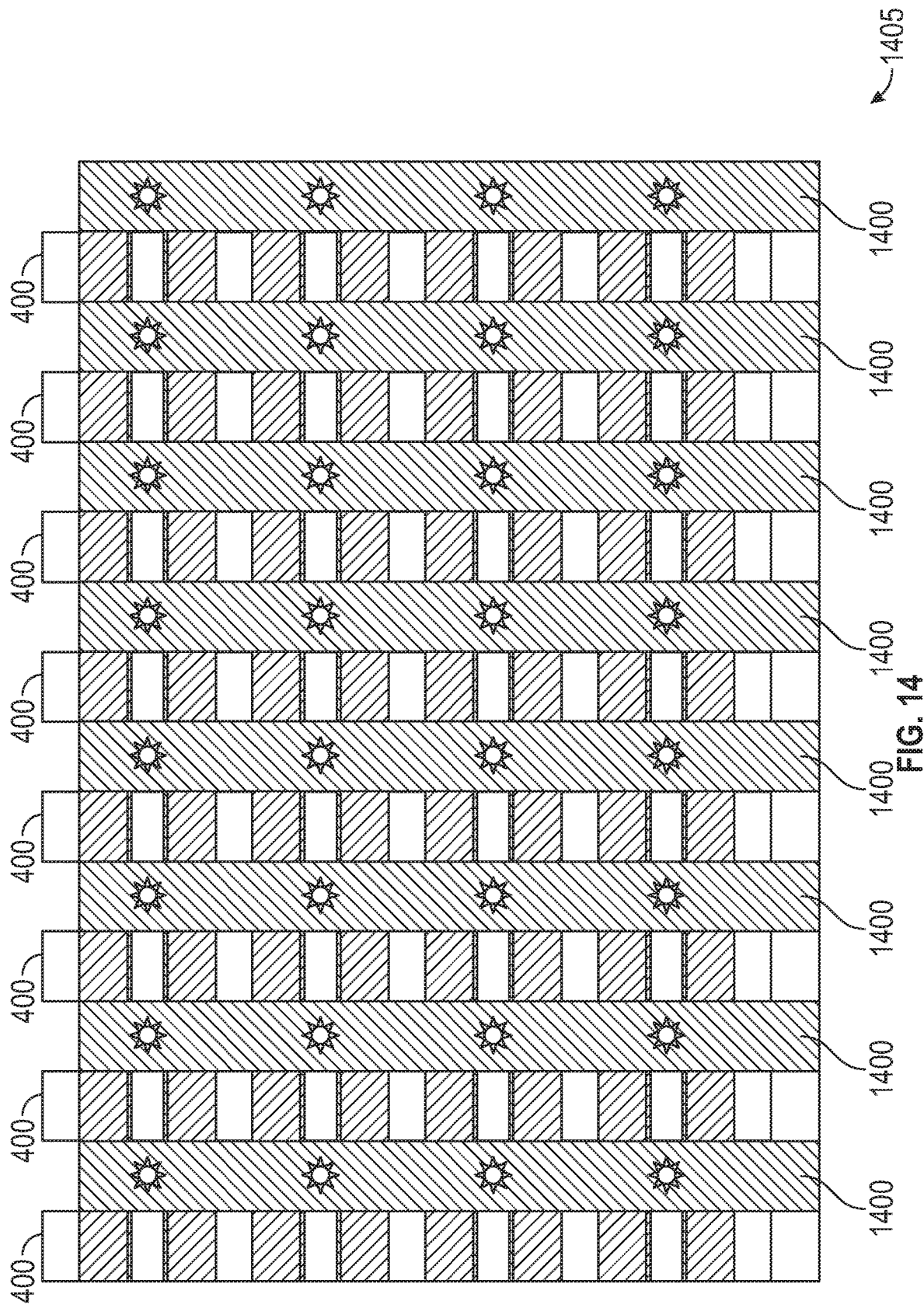
FIG. 14 illustrates a ringing layer used to connect ToF switch bars together.
Figure 15:
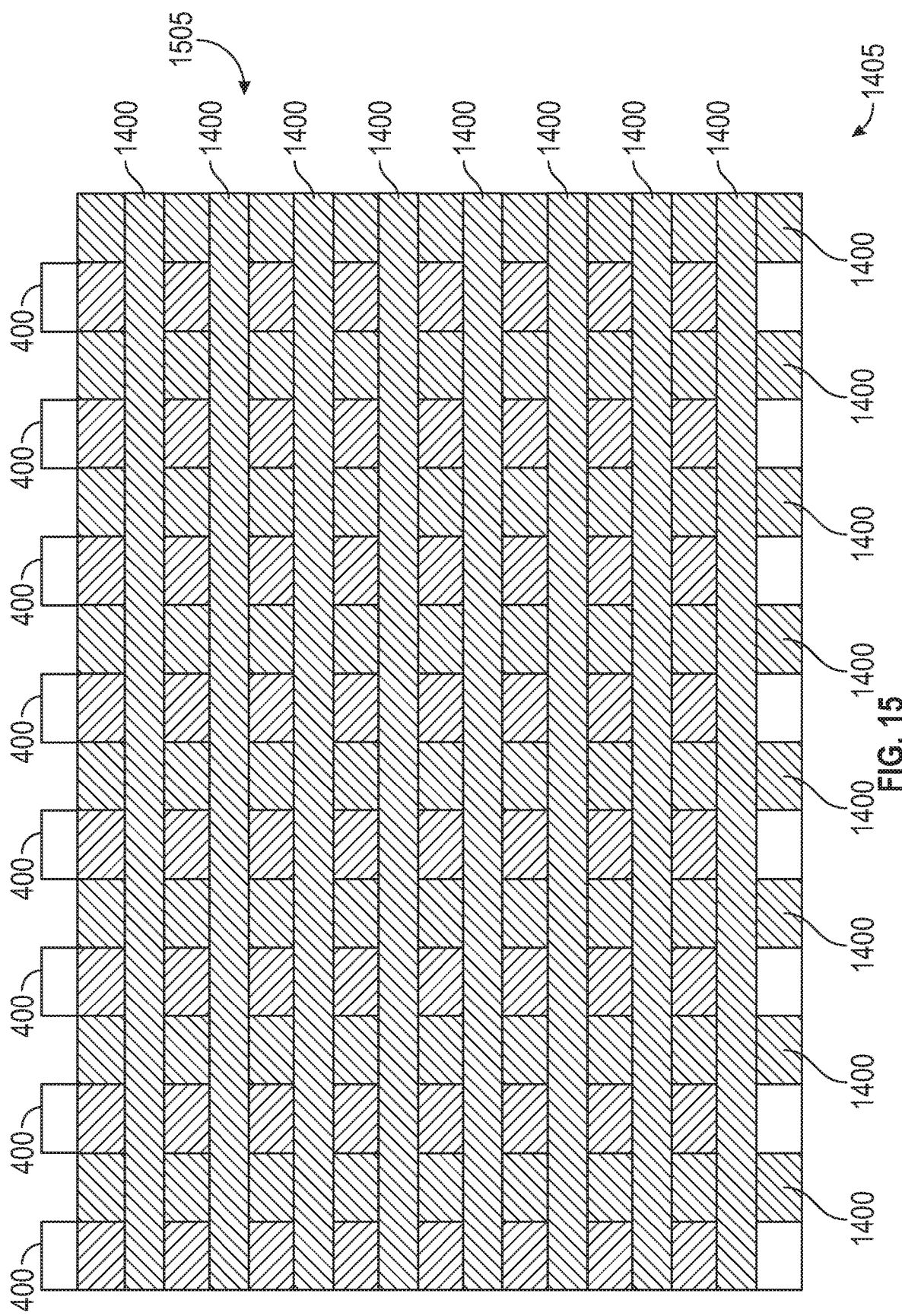
FIG. 15 illustrates a ringing layer used to connect ToF switch bars together.

FIG. 14 and FIG. 15 illustrate a ringing layer that may be used to connect ToF switch bars 1100 together. Embodiments of the disclosure may provide an optional ringing layer above ToF switch bars 1100 using a plurality of ringing bars 1400 to provide the ringing layer. Ringing bars 1400 may be similar to leaf switch bars 400. FIG. 14 is a top view showing a first plurality of ringing bars 1405 connected to ends 1125 of ToF switch bars 1100 of FIG. 13. FIG. 15 shows a second plurality of ringing bars 1505 arranged orthogonally to and connected to first plurality of ringing bars 1405 of FIG. 14. Accordingly, the combination of first plurality of ringing bars 1405 and second plurality of ringing bars 1505 may connect ToF switch bars 1100 together and thus provide a ringing layer. Second plurality of ringing bars 1505 shown in FIG. 15 may have their second side of ports on the top that may to provide connectivity to management servers, or to routers that route to other similar three-dimensional switches.

Serviceability

A networking device comprising the aforementioned leaf switch bars 400, ToP switch bars 700, and ToF switch bars 1100 may be assembled and connected as described above and placed in a standard rack. However, if the networking device is mounted in a standard rack in a conventional way, serviceability may be a problem. For example, while one type of switch bars (e.g., switch leaf switch bars 400) may be replaceable by sliding them from the networking device through the front of the rack, the orthogonal dimension (e.g., ToP switch bars 700) may not be serviceable because they would have to be withdrawn through the mechanical uprights on the side of the rack or perhaps even require additional service volume in the space occupied by adjacent racks.

Figure 16:
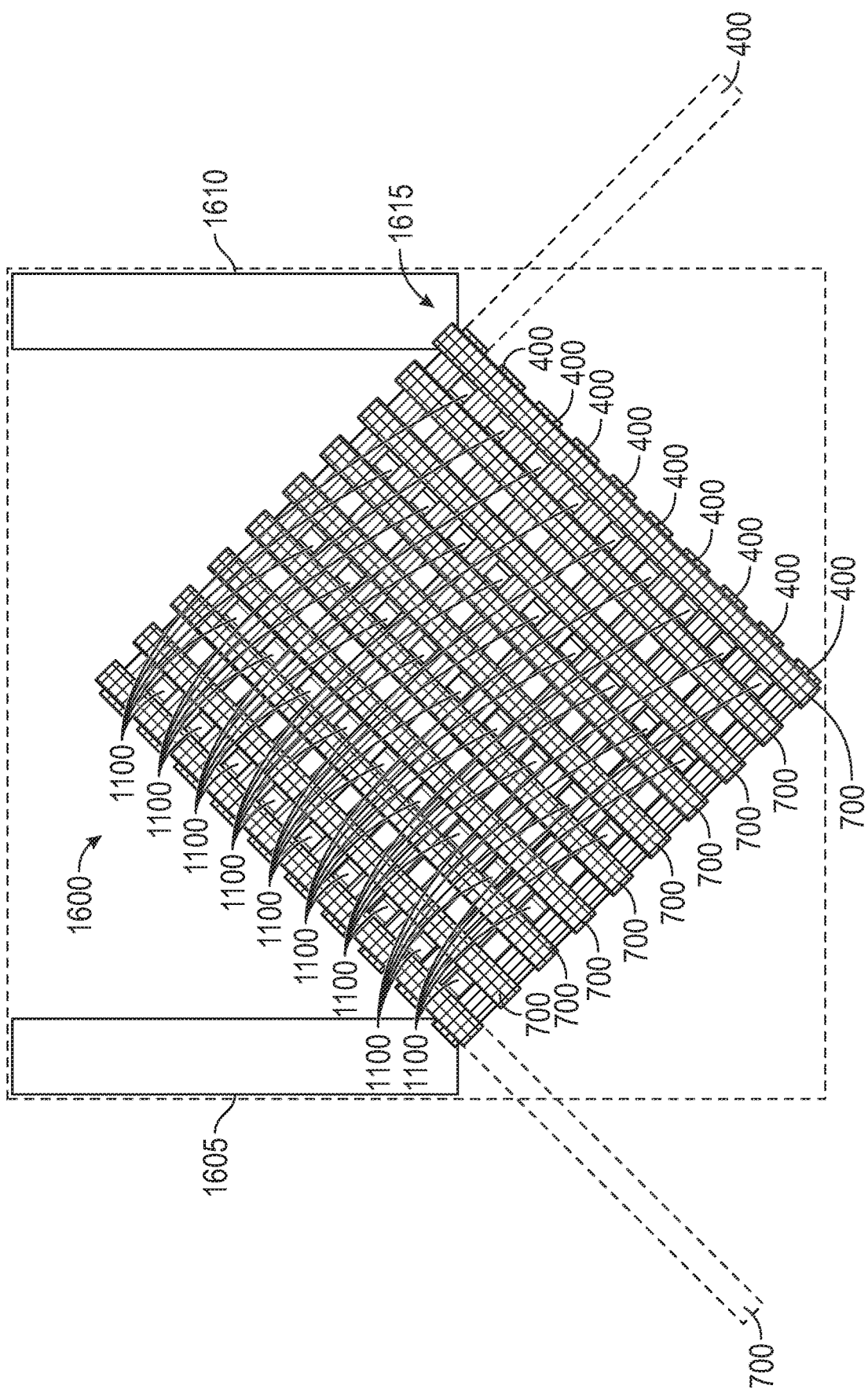
FIG. 16 illustrates rotating a networking device.

FIG. 16 illustrates a way to address the serviceability problem by rotating a networking device 1600 about the Z axis by approximately 45 degrees (or any angle that may facilitate improvements in serviceability and equipment density). As shown in FIG. 16, networking device 1600 may stay within the dashed outline of a standard rack. This may allow both leaf switch bars 400 and ToP switch bars 700 to be slidably removed through the front of the rack without interference from the rack's structural components (e.g., a first upright 1605 and a second upright 1610) or adjacent racks, as shown by the dotted positions of the partially withdrawn leaf switch bar 400 and ToP switch bar 700.

This rotation may be fixed, or networking device 1600 may be mounted on hinges (or a hinged device) allowing it to pivot about a pivot point 1615 to the position shown in FIG. 16 for servicing, and pivoted back to a position more fully between first upright 1605 and second upright 1610 for normal operation. ToF switch bars 1100 may also have serviceability challenges that may be addressed by leaving space above networking device 1600 in the rack open, and pulling ToF switch bars 1100 out through the top of the rack. In other embodiments, a second axis of pivot may allow networking device 1600 to tip down to facilitate the withdrawal of ToF switch bars 1100. Also, as stated above, the ToF switch bar 1100 length may be divided (e.g., by 2 or 4). Accordingly, ToF switch bars 1100 may be disassembled as they are withdrawn from the top of networking device 1600, and reassemble as replacement parts are they are inserted. This may use a shorter mechanical volume, which may fit the space available in the rack.

Redundant Power Supplies

Figure 17:
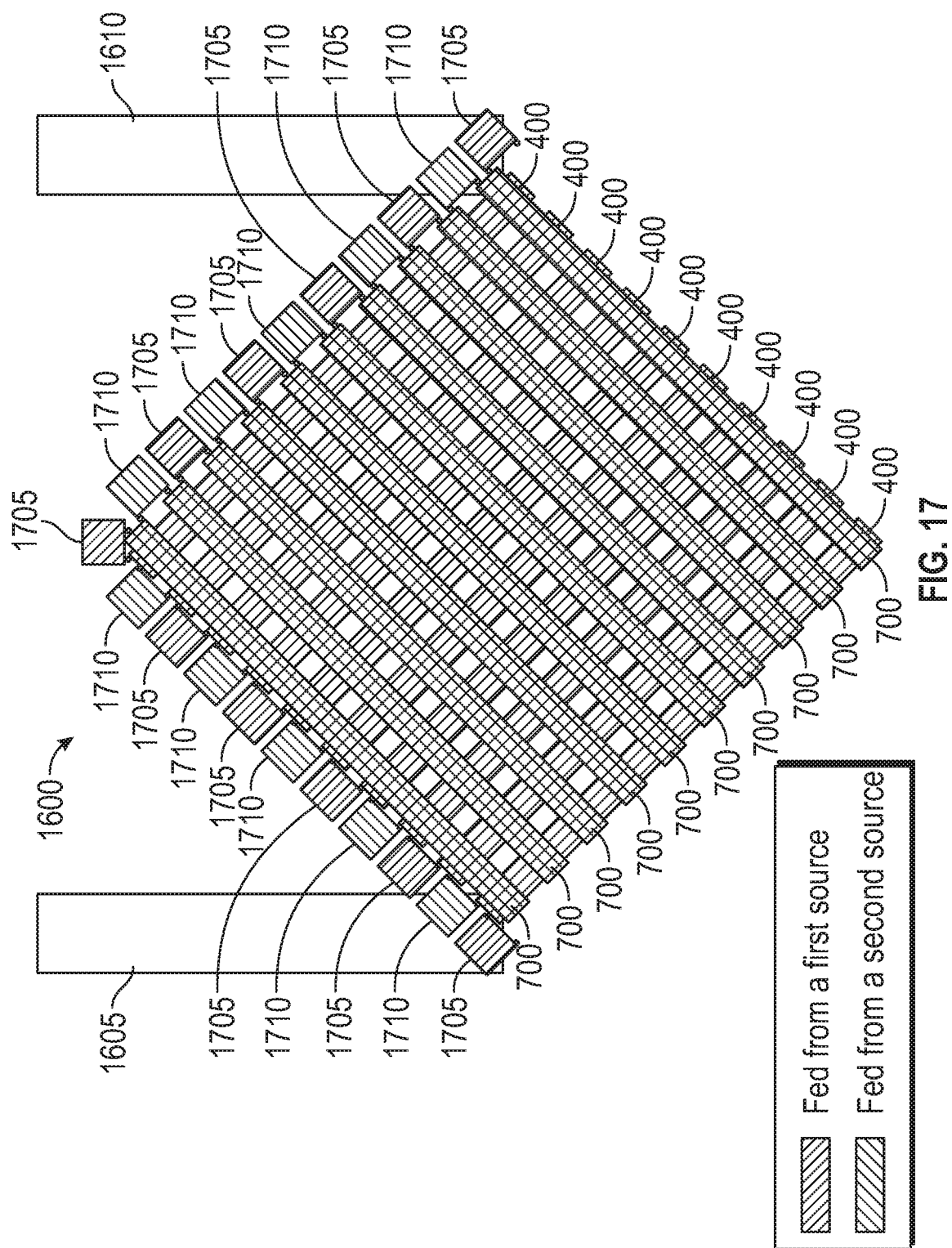
FIG. 17 illustrates redundant power supplies.

Consistent with embodiments of the disclosure, redundant power supplies may be provided to networking device 1600. Each pod may have an array of power supplies that may comprise power conditioning and distribution elements. For example, as shown in FIG. 17, the array of power supplies may comprise a first plurality of power supplies 1705 fed by a first source and a second plurality of power supplies 1710 fed by a second source.

Power supplies alternating between first plurality of power supplies 1705 and second plurality of power supplies 1710 may be shared among pairs of leaf switch bars 400. In other words, each one of leaf switch bars 400 may be fed from the first source through one of first plurality of power supplies 1705 and each one of leaf switch bars 400 may be fed from the second source through one of second plurality of power supplies 1710. This may provide fault tolerance should any single power supply fail or if one of the first source or the second source is lost.

Similarly, power supplies alternating between first plurality of power supplies 1705 and second plurality of power supplies 1710 may be shared among pairs of ToP switch bars 700. In other words, each one of ToP switch bars 700 may be fed from the first source through one of first plurality of power supplies 1705 and each one of ToP switch bars 700 may be fed from the second source through one of second plurality of power supplies 1710.

Furthermore, ToF switch bars 1100 may be fed by first plurality of power supplies 1705 and second plurality of power supplies 1710 in a way similar to how leaf switch bars 400 and ToP switch bars 700 are fed as described above, but these power supplies may be located below networking device 1600. In this way, because the power supplies of networking device 1600 may be fed from multiple sources, power may not be lost to networking device 1600 when one of the sources is lost. Also, power may not be lost to a switch bar when a power supply fails.

While FIG. 17 illustrates one pod level of networking device 1600, the redundant power supply system described above may be repeated for other pod levels of networking device 1600. For example, each pod level of networking device 1600 may have its own first plurality of power supplies 1705 and second plurality of power supplies 1710 or several pod levels of networking device 1600 may share first plurality of power supplies 1705 and second plurality of power supplies 1710. In other words, power supplies may serve switch bars of only a single pod level, or may extend vertically up the rack to service switch bars in multiple (or all) pod levels. Furthermore, when leaf switch bars 400, ToP switch bars 700, or ToF switch bars 1100 are slidably inserted into networking device 1600 or slidably removed from networking device 1600, switch bars may make a blind connection or disconnection from their respective redundant power supplies.

Cooling

Figure 18:
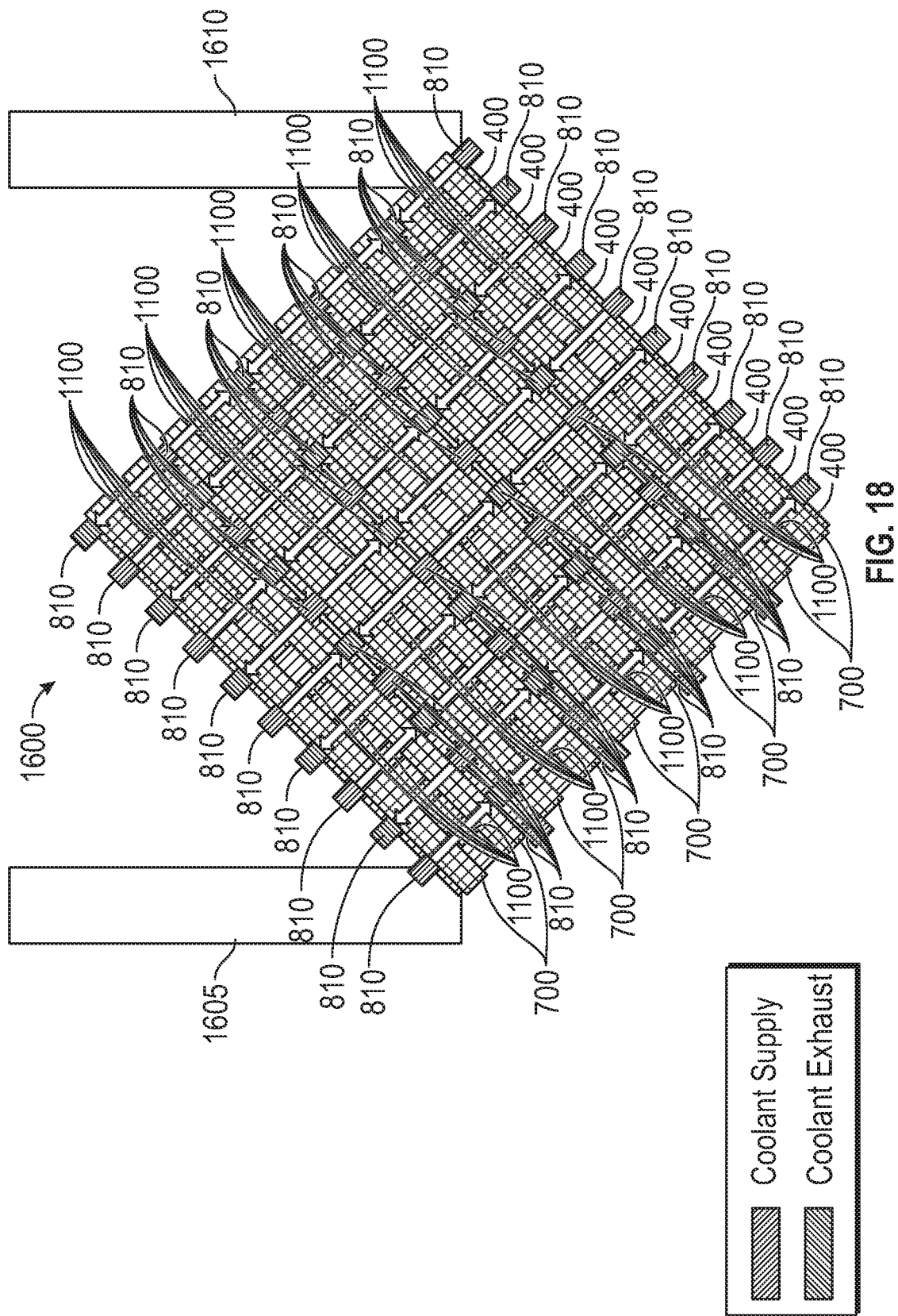
FIG. 18 illustrates a cooling system.

FIG. 18 illustrates a cooling system consistent with embodiments of the disclosure. Due to the densely packed architecture of networking device 1600, cooling may be needed. As described above with respect to FIG. 8 and FIG. 13, second interstice gaps 810 may be used for cooling passages. As shown in FIG. 18, networking device 1600 may include a plurality of cooling passages (i.e., second interstice gaps 810). For example, half of the passages (i.e., first interstice gaps 805 of FIG. 8) between leaf switch bars 400 and ToP switch bars 700 may be filled by ToF switch bars 1100, leaving the other half (i.e., second interstice gaps 810 of FIG. 8) to support cooling as cooling passages.

Cooling flows may be divided into two sets of vertical passages passing up through the pods in networking device 1600. A first set of vertical passages may comprise a first portion of the plurality of the cooling passages and may supply coolant. This first set of vertical passages may be pressurized by fans below the bottom pod of networking device 1600 and may be blocked on top of the top pod of networking device 1600. A second set of the vertical passages may comprise a second portion of the plurality of the cooling passages and may exhaust coolant. This second set of vertical passages may be evacuated by fans above the top pod of networking device 1600 and blocked from below the bottom pod of networking device 1600.

Lateral channels may pass from the cooling supply passages, through one or more switch bar, and back to cooling exhaust passages. The small arrows show coolant flow paths through leaf switch bars 400. Thicker arrows show paths from a coolant supply channel, through one ToP switch bar 700, through a vertical ToF switch bar 1100, through a second ToP switch bar 700 and out a cooling exhaust passage. This flow pattern may be modified to put fewer bars in series to improve the thermal performance. Baffles lining both the cooling supply passages and the cooling exhaust passages may, for example, direct required amounts of coolant through ducts and through the switch bars, where internal heat sinks dissipate the heat generated by the switch bar's internal components, and carry it away with the flowing coolant.

In another embodiment, the aforementioned coolant supply and exhaust passages may be replaced with liquid cooled bars disposed in second interstice gaps 810. These liquid cooled bars may have cold liquid coolant flowing from below the bottom pod of networking device 1600, through internal channels in the liquid cooled bars chilling their sides, up to the top, turning 180 degrees, and back down, and the warmed coolant may be collected below the bottom pod of networking device 1600. Two such coolant paths may be provided in each liquid cooled bar, and isolated from each other to provide cooling redundancy. Fluid manifolds below the bottom pod may connect the liquid cooled bars to coolant supply and return plumbing. Each switch bar may have heat pipes and thermal interfaces (similar to "wedge locks") to thermally connect the high power components within the switch bar to the surface of the liquid cooled bars to remove the excess heat to the flowing liquid coolant. The heat from dissipative components within leaf switch bars 400, ToP switch bars 700, and vertical ToF switch bars 1100 may be moved to the liquid cooled bars. This may be accomplished through mechanical contact between selected points (that may be thermally tied to hot components within the switch bars) on the outside of the switch bars and cold bars.

Connectors

Figure 19:
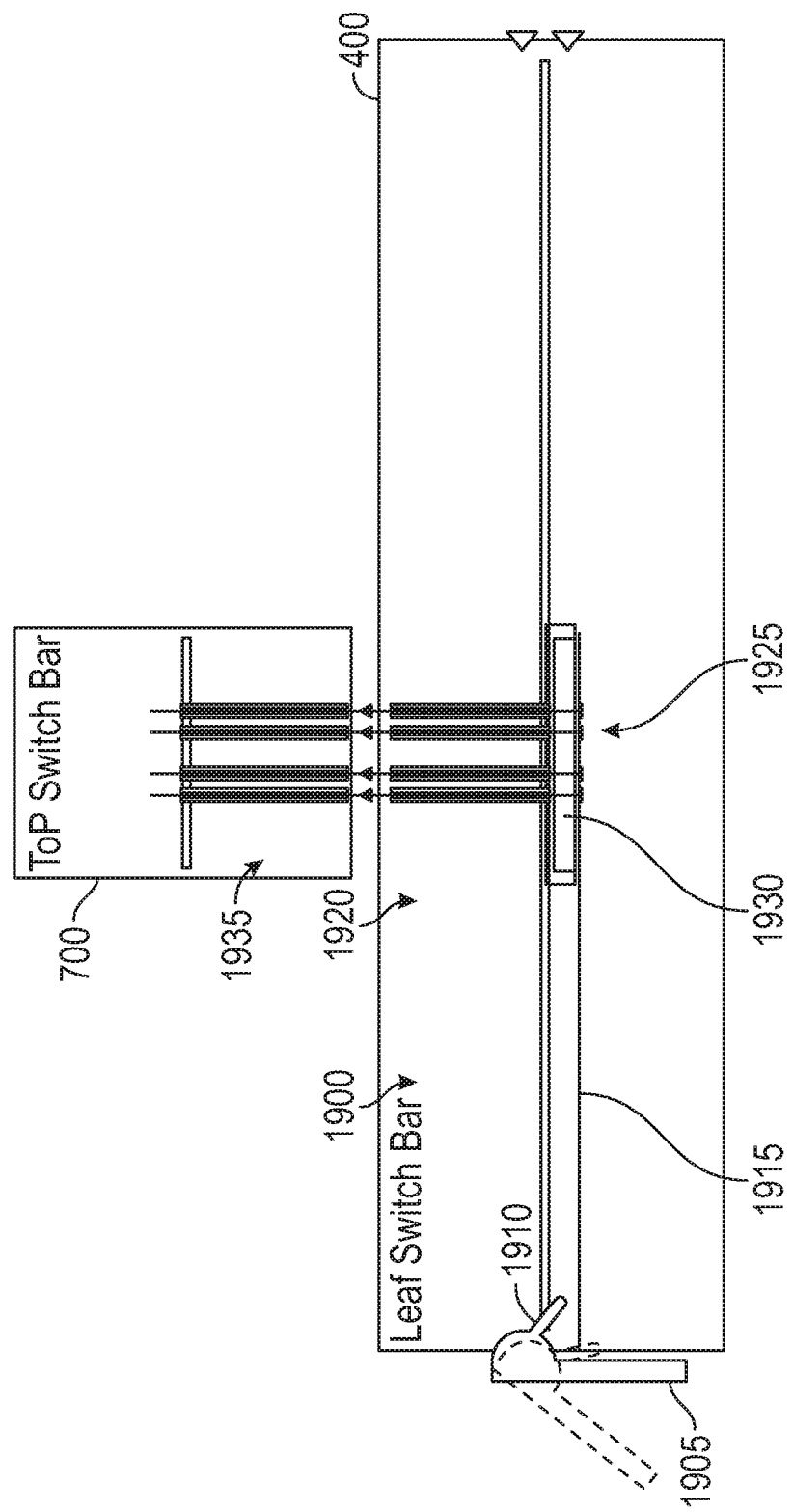
FIG. 19 illustrates a retractable mechanical connector mechanism.
Figure 20:
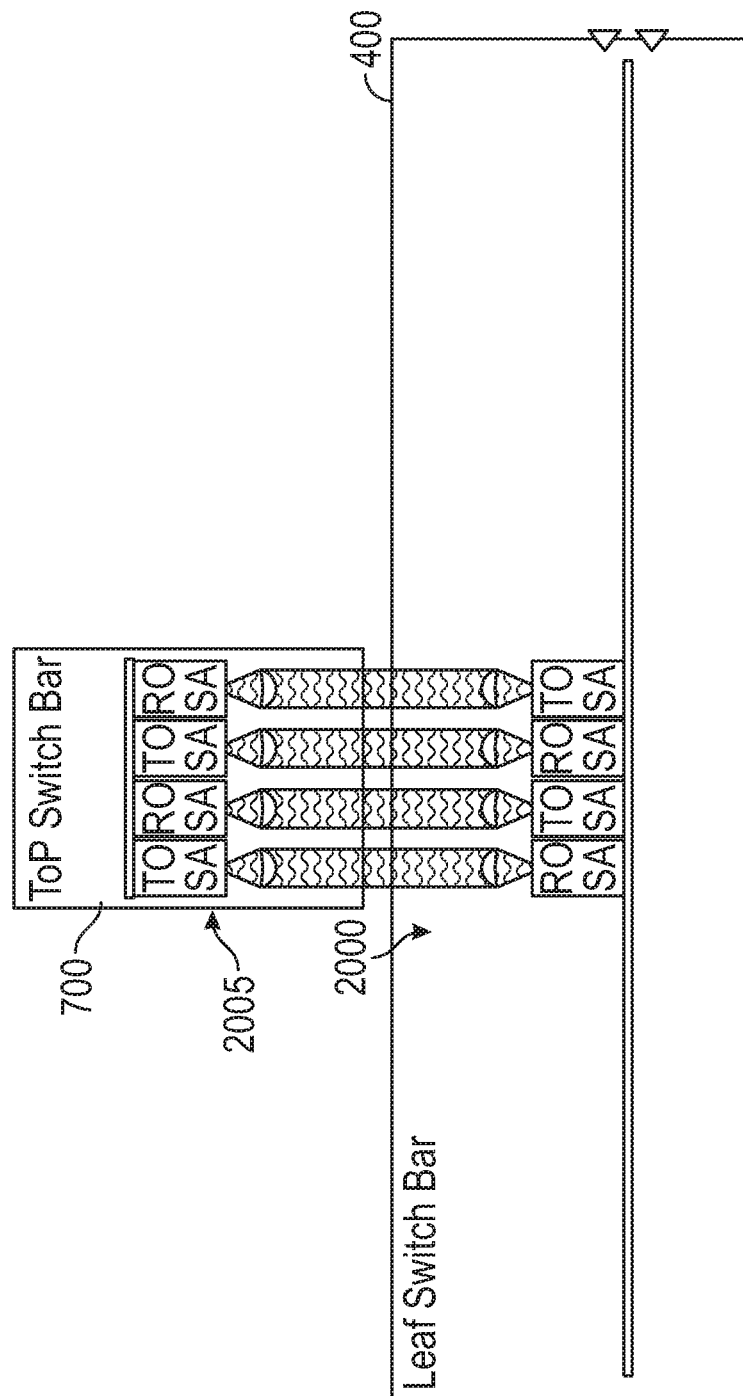
FIG. 20 illustrates an optical connector mechanism.

FIG. 19 and FIG. 20 illustrate connectors that may be used to connect connectivity bars 205, leaf switch bars 400, ToP switch bars 700, ToF switch bars 1100, and ringing bars 1400 consistent with embodiments of the disclosure. Connectors may be illustrated, for example, by eight-pointed stars in FIGS. 2 through 7 and FIGS. 9 through 14. The connectors may be inexpensive, compact, reliable, and have adequate performance to pass bidirectional data links in, for example, the 10 Gb/s-40 Gb/s range across a few centimeters between circuit boards in adjacent switch bars. The connectors may support the serviceability scenarios where any switch bar is slidably removed from networking device 1600 or slidably inserted into networking device 1600 without interfering with or damaging the connectors from adjacent or orthogonal switch bars. Embodiments of the disclosure may include a retractable mechanical connector mechanism (e.g., FIG. 19) and an optical connector mechanism (e.g., FIG. 20).

FIG. 19 illustrates a retractable mechanical connector mechanism 1900. Retractable mechanical connector mechanism 1900 may comprise an ejector handle 1905 having a cam 1910, a linkage 1915 activated by cam 1910, at least one pin (e.g., one of plurality of pins 1920) having a head (e.g., one of plurality of heads 1925) connected to linkage 1915, and a compression element 1930 adjacent to the head. Plurality of pins 1920 may be retractable by operation of retractable mechanical connector mechanism 1900 to cover, for example, a few centimeters of distance between circuit boards inside of a pair of switch bars. An array of telescoping pins (e.g., plurality of pins 1920 that may be similar to "pogo pins" used in circuit board test fixtures) may extend beyond the boundaries of a switch bar or be retracted within the switch bar if that switch bar is to be removed from or inserted into networking device 1600.

Retractable mechanical connector mechanism 1900 shown in FIG. 19 may be activated by ejector handle 1905 that may be operated when leaf switch bar 400 is to be removed from or inserted into networking device 1600. When ejector handle 1905 is operated to its retraction position (e.g., shown in the dotted line position), cam 1910 may push down linkage 1915 that may move down "T" shaped plurality of heads 1925 at the ends of each of plurality of pins 1920. This operation of ejector handle 1905 may compress compression element 1930 (e.g., comprising, for example, an elastomer spring) to move plurality of pins 1920 down fully inside an enclosure of leaf switch bar 400. This may create enough clearance for leaf switch bar 400 to slidably move without plurality of pins 1920 grinding on ToP switch bar 700 as it passes.

After leaf switch bar 400 is inserted into networking device 1600, ejector handle 1905 may be returned to its seated (e.g., fully inserted) position, linkage 1915 may move back up, and compression element 1930 may gently extend plurality of pins 1920 until they make solid contact with corresponding pins (i.e., a plurality of pins 1935) coming from ToP switch bar 700. ToP switch bar 700 may have a retractable mechanical connector mechanism similar to retractable mechanical connector mechanism 1900 to retract its plurality of pins 1935 up and inside ToP switch bar 700 so that ToP switch bar 700 may be slidably moved without plurality of pins 1935 colliding with plurality of pins 1920 of leaf switch bars 400 as they pass by. Although four pins are shown in plurality of pins 1920 and plurality of pins 1935, embodiments of the disclosure may include any number of pins and is not limited to four pins. Connections between connectivity bars 205 and leaf switch bars 400, ToP switch bars 700 and ToF switch bars 1100, and ToF switch bars 1100 and ringing bars 1400 may use a similar connector mechanism. The pin geometry, spacing, and the dialectic materials between plurality of pins 1920 and plurality of pins 1935 may be chosen to provide the desired impedance or transmission line characteristics.

FIG. 20 illustrates an optical connector mechanism 2000 consistent with embodiments of the disclosure. As shown in FIG. 20, instead of mechanics and linkages to move physical electrical contacts, this embodiment may use free space optical light beams to cross the few centimeters between switch bars. Optical connector mechanism 2000 may begin with a Transmit Optical Sub Assembly (TOSA) that may accept serial bit streams from within leaf switch bar 400 and convert them to modulated optical signals. A lens may shape and collimate the emitted light that crosses a gap between leaf switch bar 400 and ToP switch bar 700. Another lens in an optical connector mechanism 2005 of ToP switch bar 700 may intercept the beam and may focus it on a Receive Optical Sub Assembly (ROSA) that may demodulate and create an electrical signal for ToP switch bar 700. Pairs of receivers and transmitters may be used back-to-back to create bidirectional links. Multiple links may be run in parallel to increase the capacity. Because there may be no protruding pins to interfere with switch bar movements, this embodiment may be more mechanically robust. However, the optical embodiment may be more expensive and may consume more power.

Embodiments of the disclosure may do away with thousands of inter-switch cables. It may improve the volumetric density of the switching solutions for highly interconnected data centers, freeing up more rack space for servers. It may be easier to install, monitor, and service. It may enable lower power dissipation for a data center's switching functions. It also may have important pay-as-you-grow properties, so it may be unnecessary to install full complements of full-sized switches from the onset. Individual bars and pods may be equipped as necessary as server counts increase and traffic grows.

Embodiments of the disclosure may comprise an apparatus. The apparatus may comprise a first plurality of switch bars each comprising a first switch type arranged parallel to one another; a second plurality of switch bars each comprising a second switch type arranged parallel to one another; and a third plurality of switch bars each comprising a third switch type arranged parallel to one another, wherein the first plurality of switch bars, the second plurality of switch bars, and the third plurality of switch bars are arranged orthogonally wherein a first one of the first plurality of switch bars is connected to a first one of the second plurality of switch bars via a retractable mechanical connector mechanism.

The retractable mechanical connector mechanism may comprise an ejector handle having a cam; a linkage activated by the cam; at least one pin having a head connected to the linkage; and a compression element adjacent the head.

The retractable mechanical connector mechanism may have a retracted position in which the ejector handle is in a first position in which the cam pushes against the linkage to pull in the at least one pin and compress the compression element wherein the at least one pin is fully inside the first one of the first plurality of switch bars when the mechanical connector mechanism is in the retracted position.

The retractable mechanical connector mechanism may have an extended position in which the ejector handle is in a second position in which the cam releases the linkage to extend the at least one pin and allow the compression element to press against the head wherein the at least one pin extends from the first one of the first plurality of switch bars when the mechanical connector mechanism is in the extended position.

The compression element comprises an elastomer spring.

The first switch type may comprise a leaf switch, the second switch type may comprise a top of pod switch, and the third switch type may comprise a top of fabric switch.

The first plurality of switch bars may be adjacent to and connected to the second plurality of switch bars and wherein the second plurality of switch bars are adjacent to and connected to the third plurality of switch bars.

Other embodiments of the disclosure may comprise an apparatus. The apparatus may comprise a first plurality of switch bars each comprising a first switch type arranged parallel to one another; a second plurality of switch bars each comprising a second switch type arranged parallel to one another; and a third plurality of switch bars each comprising a third switch type arranged parallel to one another, wherein the first plurality of switch bars, the second plurality of switch bars, and the third plurality of switch bars are arranged orthogonally wherein a first one of the first plurality of switch bars is connected to a first one of the second plurality of switch bars via an optical connector mechanism.

The optical connector mechanism may comprise at least one optical receiver and optical transmitter pair used back-to-back to create a bidirectional link.

The optical connector mechanism may comprise a plurality of optical receiver and optical transmitter pairs used back-to-back to create a plurality of bidirectional links.

The first switch type may comprise a leaf switch, the second switch type may comprise a top of pod switch, and the third switch type may comprise a top of fabric switch.

The first plurality of switch bars may be adjacent to and connected to the second plurality of switch bars and wherein the second plurality of switch bars are adjacent to and connected to the third plurality of switch bars.

Other embodiments of the disclosure may comprise a method. The method may comprise providing a first plurality of switch bars each comprising a first switch type arranged parallel to one another; providing a second plurality of switch bars each comprising a second switch type arranged parallel to one another; providing a third plurality of switch bars each comprising a third switch type arranged parallel to one another, wherein the first plurality of switch bars, the second plurality of switch bars, and the third plurality of switch bars are arranged orthogonally; and operating a mechanical connector mechanism wherein a first one of the first plurality of switch bars is connected to and disconnected from a first one of the second plurality of switch bars via the mechanical connector mechanism.

Operating the mechanical connector mechanism may comprise operating the mechanical connector mechanism comprising an ejector handle having a cam; a linkage activated by the cam; at least one pin having a head connected to the linkage; and a compression element adjacent the head.

Operating the mechanical connector mechanism may comprise operating the mechanical connector mechanism into a retracted position.

Operating the mechanical connector mechanism may comprise operating the mechanical connector mechanism into an extended position.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example, but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Moreover, the semantic data consistent with embodiments of the disclosure may be analyzed without being stored. In this case, in-line data mining techniques may be used as data traffic passes through, for example, a caching server or network router. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including, but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the components may be integrated onto a single integrated circuit. Such an SOC device may include one or more processing units, graphics units, communications units, switching fabrics, routers, system virtualization units and various application functionality of which may be integrated (or "burned") onto the chip substrate as a single integrated circuit. When operating via an SOC, the functionality described herein with respect to embodiments of the disclosure, may be performed via application-specific logic integrated with other components on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
a first plurality of switch bars each comprising a first switch type arranged parallel to one another;
a second plurality of switch bars each comprising a second switch type arranged parallel to one another; and
a third plurality of switch bars each comprising a third switch type arranged parallel to one another, wherein the first plurality of switch bars, the second plurality of switch bars, and the third plurality of switch bars are arranged orthogonally wherein a first one of the first plurality of switch bars is connected to a first one of the second plurality of switch bars via a retractable mechanical connector mechanism wherein the retractable mechanical connector mechanism comprises an ejector handle having a cam, a linkage activated by the cam, at least one pin having a head connected to the linkage, and a compression element adjacent the head.

2. The apparatus of claim 1, wherein the retractable mechanical connector mechanism has a retracted position in which the ejector handle is in a first position in which the cam pushes against the linkage to pull in the at least one pin and compress the compression element wherein the at least one pin is fully inside the first one of the first plurality of switch bars when the mechanical connector mechanism is in the retracted position.

3. The apparatus of claim 1, wherein the retractable mechanical connector mechanism has an extended position in which the ejector handle is in a second position in which the cam releases the linkage to extend the at least one pin and allow the compression element to press against the head wherein the at least one pin extends from the first one of the first plurality of switch bars when the mechanical connector mechanism is in the extended position.

4. The apparatus of claim 1, wherein the compression element comprises an elastomer spring.

5. The apparatus of claim 1, wherein the first switch type comprises a leaf switch.

6. The apparatus of claim 1, wherein the second switch type comprises a top of pod switch.

7. The apparatus of claim 1, wherein the third switch type comprises a top of fabric switch.

8. The apparatus of claim 1, wherein the first plurality of switch bars are adjacent to and connected to the second plurality of switch bars and wherein the second plurality of switch bars are adjacent to and connected to the third plurality of switch bars.

9. An apparatus comprising:
a first plurality of switch bars each comprising a first switch type arranged parallel to one another;
a second plurality of switch bars each comprising a second switch type arranged parallel to one another; and
a third plurality of switch bars each comprising a third switch type arranged parallel to one another, wherein the first plurality of switch bars, the second plurality of switch bars, and the third plurality of switch bars are arranged orthogonally wherein a first one of the first plurality of switch bars is connected to a first one of the second plurality of switch bars via a retractable mechanical connector mechanism wherein the retractable mechanical connector mechanism comprises an ejector handle having a cam, a linkage activated by the cam, and at least one pin having a head connected to the linkage wherein the retractable mechanical connector mechanism has a retracted position in which the ejector handle is in a first position in which the cam pushes against the linkage to pull in the at least one pin and compress a compression element wherein the at least one pin is fully inside the first one of the first plurality of switch bars when the mechanical connector mechanism is in the retracted position.

10. The apparatus of claim 9, wherein the retractable mechanical connector mechanism has an extended position in which the ejector handle is in a second position in which the cam releases the linkage to extend the at least one pin and allow the compression element to press against the head wherein the at least one pin extends from the first one of the first plurality of switch bars when the mechanical connector mechanism is in the extended position.

11. The apparatus of claim 9, wherein the compression element comprises an elastomer spring.

12. The apparatus of claim 9, wherein the first switch type comprises a leaf switch.

13. The apparatus of claim 9, wherein the second switch type comprises a top of pod switch.

14. The apparatus of claim 9, wherein the third switch type comprises a top of fabric switch.

15. The apparatus of claim 9, wherein the first plurality of switch bars are adjacent to and connected to the second plurality of switch bars and wherein the second plurality of switch bars are adjacent to and connected to the third plurality of switch bars.

16. An apparatus comprising:
a first plurality of switch bars each comprising a first switch type arranged parallel to one another;
a second plurality of switch bars each comprising a second switch type arranged parallel to one another; and
a third plurality of switch bars each comprising a third switch type arranged parallel to one another, wherein the first plurality of switch bars, the second plurality of switch bars, and the third plurality of switch bars are arranged orthogonally wherein a first one of the first plurality of switch bars is connected to a first one of the second plurality of switch bars via a retractable mechanical connector mechanism wherein the retractable mechanical connector mechanism comprises an ejector handle having a cam, a linkage activated by the cam, and at least one pin having a head connected to the linkage wherein the retractable mechanical connector mechanism has an extended position in which the ejector handle is in a second position in which the cam releases the linkage to extend the at least one pin and allow a compression element to press against the head wherein the at least one pin extends from the first one of the first plurality of switch bars when the mechanical connector mechanism is in the extended position.

17. The apparatus of claim 16, wherein the retractable mechanical connector mechanism has a retracted position in which the ejector handle is in a first position in which the cam pushes against the linkage to pull in the at least one pin and compress the compression element wherein the at least one pin is fully inside the first one of the first plurality of switch bars when the mechanical connector mechanism is in the retracted position.

18. The apparatus of claim 16, wherein the compression element comprises an elastomer spring.

19. The apparatus of claim 16, wherein the first switch type comprises a leaf switch.

20. The apparatus of claim 16, wherein the second switch type comprises a top of pod switch.

* * * * *